US011744033B2

(12) United States Patent
Hur et al.

(10) Patent No.: US 11,744,033 B2
(45) Date of Patent: Aug. 29, 2023

(54) STORAGE DEVICE, LATCH ASSEMBLY AND STORAGE DEVICE ASSEMBLY COMPRISING THE SAME

(71) Applicant: SAMSUNG ELECTRONICS CO., LTD., Suwon-si (KR)

(72) Inventors: Sung Chui Hur, Yongin-si (KR); Bum Jun Kim, Seoul (KR); Jung Soo Kim, Yongin-si (KR); Young Seok Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 17/228,155

(22) Filed: Apr. 12, 2021

(65) Prior Publication Data

US 2022/0117107 A1  Apr. 14, 2022

(30) Foreign Application Priority Data

Oct. 13, 2020 (KR) .......................... 10-2020-0131583

(51) Int. Cl.
*H05K 5/00* (2006.01)
*H05K 7/12* (2006.01)
(Continued)

(52) U.S. Cl.
CPC .............. *H05K 7/12* (2013.01); *H05K 5/026* (2013.01); *H05K 5/0217* (2013.01); *H01R 13/6273* (2013.01)

(58) Field of Classification Search
CPC ........ H05K 7/12; H05K 5/0217; H05K 5/026; H05K 7/1417; H01R 13/6273;
(Continued)

(56) References Cited

U.S. PATENT DOCUMENTS 7,077,678 B1 * 7/2006 Korsunsky ......... H01R 12/7005
439/328
7,517,252 B2    4/2009 Ni et al.
(Continued)

FOREIGN PATENT DOCUMENTS

CN    107678508 A    2/2018
CN    209946788 U    1/2020
CN    210776471 U    6/2020

OTHER PUBLICATIONS

Communication dated Jan. 5, 2022 by the European Patent Office in EP Application No. 21184977.3.

*Primary Examiner* — Rockshana D Chowdhury
(74) *Attorney, Agent, or Firm* — Sughrue Mion, PLLC

(57) ABSTRACT

A storage device assembly is provided. The storage device assembly includes a latch assembly having a body and a hook mounted on the body, the hook having elasticity and having distal ends thereof bend away from the body; and a storage device to be joined to the latch assembly. The storage device includes a memory module including a memory connector, and a first enclosure and a second enclosure that encase the memory module except for an opening through which the memory connector is accessible. The first enclosure includes fixing holes corresponding to the distal ends of the hook and configured to accommodate the distal ends of the hook in a configuration in which the storage device is joined to the latch assembly.

20 Claims, 20 Drawing Sheets

(51) Int. Cl.
*H05K 5/02* (2006.01)
*H01R 13/627* (2006.01)

(58) Field of Classification Search
CPC ... G06F 1/1658; G06F 1/187; G11B 23/0322; G11B 33/022
See application file for complete search history.

(56) References Cited

U.S. PATENT DOCUMENTS

| | | |
|---|---|---|
| 7,701,703 B2 | 4/2010 | Peng et al. |
| 7,701,706 B2 | 4/2010 | Peng et al. |
| 9,727,099 B1 | 8/2017 | Hastings et al. |
| 10,608,355 B2 | 3/2020 | Chen et al. |
| 10,847,188 B1* | 11/2020 | Liu ................... H05K 7/1487 |
| 2007/0202732 A1* | 8/2007 | Yahiro ............... H01R 13/6275 |
| | | 439/326 |
| 2010/0181450 A1* | 7/2010 | Hulick ................ G06F 1/1632 |
| | | 248/229.2 |
| 2010/0317218 A1* | 12/2010 | Wu ................... H01R 13/6275 |
| | | 439/352 |
| 2017/0371383 A1* | 12/2017 | Yang .................... F16B 5/0635 |
| 2018/0203489 A1* | 7/2018 | Potter ................... G06F 1/187 |
| 2018/0233855 A1* | 8/2018 | Phillips ............. H01R 13/6335 |
| 2020/0229317 A1 | 7/2020 | Martinez Araiza et al. |

* cited by examiner

300

STORAGE DEVICE, LATCH ASSEMBLY AND STORAGE DEVICE ASSEMBLY COMPRISING THE SAME

This application claims priority from Korean Patent Application No. 10-2020-0131583 filed on Oct. 13, 2020 in the Korean Intellectual Property Office, and all the benefits accruing therefrom under 35 U.S.C. 119, the disclosure of which is incorporated herein by reference in its entirety.

BACKGROUND

1. Technical Field

The present disclosure relates to a storage device, a latch assembly and a storage device assembly.

2. Description of the Related Art

A storage device including an Solid State Drive (SSD) is a device that receives and stores data from a host. Such a storage device is widely used not only in electronic apparatuses such as a desktop PC, a tablet PC, and a laptop PC, but also in related electronic devices related to mobility such as an automobile, a drone, and an aircraft.

A plurality of storage devices may be used for such an electronic device, and the plurality of storage devices may be attached or detached as needed. Therefore, there is a need for improving attachment and detachment performance of the storage device.

SUMMARY

It is an aspect to provide a storage device assembly having improved attachment and detachment performance.

It is another aspect to provide a storage device having improved attachment and detachment performance.

It is yet another aspect to provide a latch assembly having improved attachment and detachment performance.

According to an aspect of one or more embodiments, there is provided a storage device assembly comprising a latch assembly; and a storage device configured to be joined to the latch assembly, wherein the latch assembly comprises a first part, a second part which extends in a first direction from the first part, and has an upper face that is lower than an upper face of the first part, and a hook on the upper face of the second part and having elasticity, the hook including a first joining part that is bent away from the upper face of the second part at a first end of the hook, and a second joining part that is bent away from the upper face of the second part at a second end of the hook, and wherein the storage device comprises a memory module including a module board, and a memory connector on one side of the module board, a first enclosure above the memory module, the first enclosure including a first fixing hole configured to accommodate the first joining part, and a second fixing hole configured to accommodate the second joining part in a configuration in which the storage device is joined to the latch assembly, and a second enclosure below the memory module.

According to another aspect of one or more embodiments, there is provided a storage device comprising a memory module which includes a module board, and a memory connector placed on one side of the module board; a first enclosure above the memory module; and a second enclosure below the memory module, wherein the first enclosure includes a top plate, a first side wall extending from a first long side of the top plate in a first direction, and a second side wall extending from a second long side of the top plate in the first direction, the top plate includes an extension that extends beyond corresponding end portions of the first side wall and the second side wall in a second direction intersecting the first direction, a first fixing hole and a second fixing hole are formed in the extension, the first side wall includes a first bent part which is bent in a third direction intersecting the first direction and the second direction, the second enclosure includes a bottom plate, and one end of the bottom plate is spaced apart from the first bent part by an interval.

According to yet another aspect of one or more embodiments, there is provided a latch assembly comprising a first part; a second part which extends from the first part in a first direction, and has an upper face that is lower than an upper face of the first part; a third part which extends from the second part in the first direction, and has an upper face that is lower than the upper face of the second part, wherein the third part comprises a first portion having a first width measured in a second direction intersecting the first direction, and a second portion having a second width measured in the second direction, the first width being smaller than the second width.

According to yet another aspect of one or more embodiments, there is provided a storage device assembly comprising a latch assembly having a body and a hook mounted on the body, the hook having elasticity and having distal ends thereof bend away from the body; and a storage device configured to be joined to the latch assembly, the storage device comprising a memory module including a memory connector, and a first enclosure and a second enclosure that encase the memory module except for an opening through which the memory connector is accessible, wherein the first enclosure includes fixing holes corresponding to the distal ends of the hook and configured to accommodate the distal ends of the hook in a configuration in which the storage device is joined to the latch assembly.

However, aspects are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects will become more apparent by describing in detail exemplary embodiments referring to the attached drawings, in which.

DETAILED DESCRIPTION

Hereinafter, embodiments will be described referring to the accompanying drawings.

Figure 1:
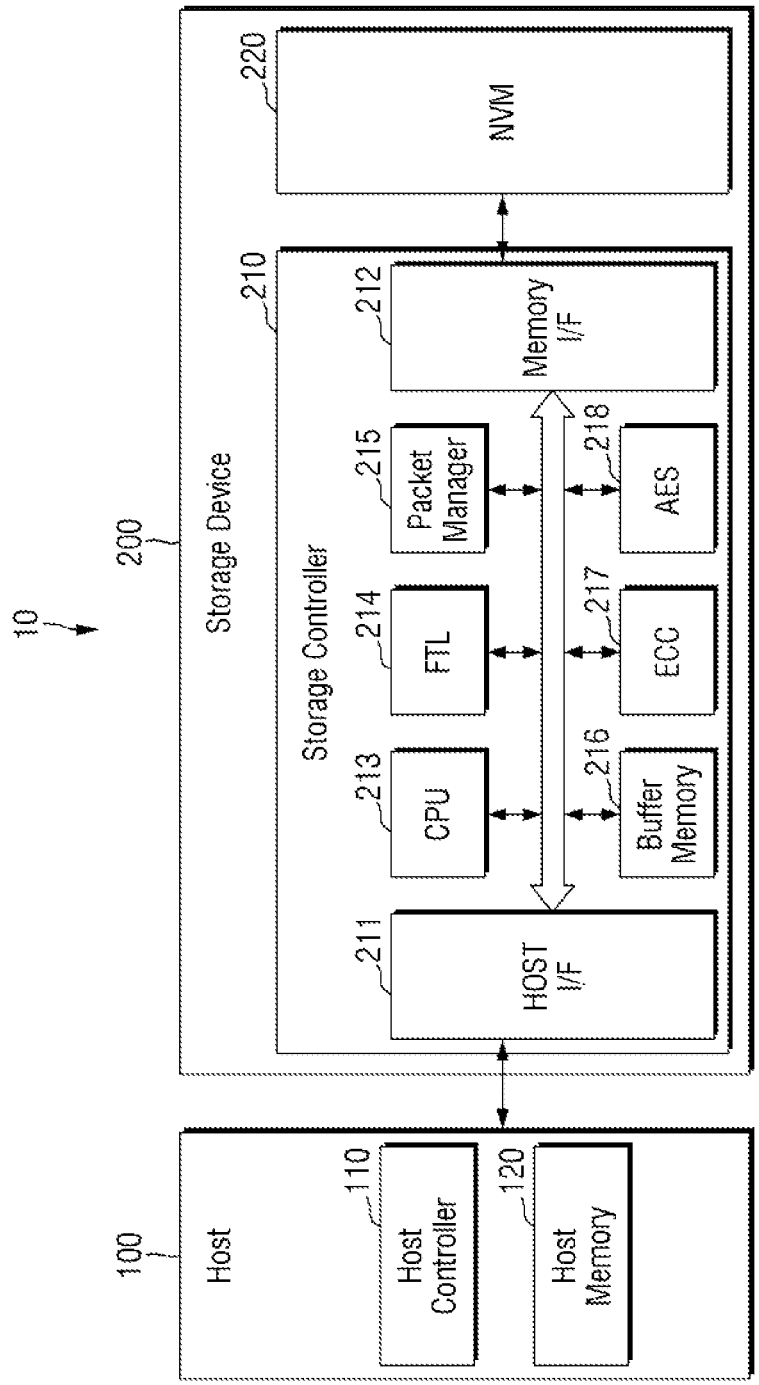
FIG. 1 is a block diagram showing a host-storage system according to some embodiments.

FIG. 1 is a block diagram showing a host-storage system according to some embodiments.

A host-storage system 10 may include a host 100 and a storage device 200. The storage device 200 may include a storage controller 210 and a non-volatile memory (NVM) 220. In some embodiments, the host 100 may include a host controller 110 and a host memory 120. The host memory 120 may function as a buffer memory for temporarily storing data to be transmitted to the storage device 200 or data transmitted from the storage device 200.

The storage device 200 may include storage medium for storing the data in response to a request from the host 100. For example, the storage device 200 may include at least one of a SSD (Solid State Drive), an embedded memory and detachable external memory. If the storage device 200 is an SSD, the storage device 200 may be a device that conforms to an NVMe (non-volatile memory express) standard. If the storage device 200 is an embedded memory or an external memory, the storage device 200 may be a device that conforms to a UFS (universal flash storage) or eMMC (embedded multi-media card) standard. The host 100 and the storage device 200 may each generate and transmit packets conforming to the adopted standard protocol.

When the non-volatile memory 220 of the storage device 200 includes a flash memory, such a flash memory may include a 2D NAND memory array or a 3D (or vertical) NAND (VNAND) memory array. As another example, the storage device 200 may also include various other types of non-volatile memories. For example, a MRAM (Magnetic RAM), a spin transfer torque (MRAM), a conductive bridging RAM (CBRAM), a FeRAM (Ferroelectric RAM), a PRAM (Phase RAM), a resistor memory (Resistive RAM) and various other types of memory may be applied as the storage device 200.

In some embodiments, the host controller 110 and the host memory 120 may be provided as different semiconductor chips. Alternatively, in some embodiments, the host controller 110 and the host memory 120 may be integrated on the same semiconductor chip. As an example, the host controller 110 may be one of a plurality of modules provided in the application processor, and such an application processor may be provided as a system on chip (SoC). Further, the host memory 120 may be an embedded memory provided in the application processor, or may be a non-volatile memory or a memory module placed outside the application processor.

The host controller 110 may manage an operation of storing the data of a buffer region (for example, record data) in the non-volatile memory 220 or storing the data of the non-volatile memory 220 (for example, read data) in the buffer region.

The storage controller 210 may include a host interface 211, a memory interface 212 and a CPU (central processing unit) 213. The storage controller 210 may further include a flash translation layer (FTL) 214, a packet manager 215, a buffer memory 216, an ECC (error correction code) 217, and an AES (advanced encryption standard) 218 engine.

The storage controller 210 may further include working memory (not shown) into which the flash translation layer (FTL) 214 is loaded, and when the CPU 211 executes the flash translation layer, the writing and reading operations of data on the non-volatile memory may be controlled.

The host interface 211 may transmit and receive packet to and from the host 100. The packet transmitted from the host 100 to the host interface 211 may include a command or data to be recorded in the non-volatile memory 220, and the packet transmitted from the host interface 211 to the host 100 may include a response to the command, data read from the non-volatile memory 220, and the like.

The memory interface 212 may transmit the data to be recorded in the non-volatile memory 220 to the non-volatile memory 220 or receive the data read from the non-volatile memory 220. The memory interface 212 may be implemented to conform to standard conventions such as Toggle or ONFI.

The flash translation layer 214 may perform various functions such as address mapping, wear-leveling, and garbage collection. The address mapping operation is an operation of changing a logical address received from a host into a physical address which is used for actually storing the data in the non-volatile memory 220. The wear-leveling is a technique for ensuring that blocks in the non-volatile memory 220 are used uniformly to prevent an excessive degradation of a particular block, and may be implemented, for example, through a firmware technique of balancing the erasure counts of the physical blocks. The garbage collection is a technique for securing an available capacity in the non-volatile memory 220 through a method of copying the valid data of a block to a new block and then erasing the existing block.

The packet manager 215 may generate a packet according to the protocol of the interface discussed with the host 100, or parse various types of information from the packet received from the host 100. Further, the buffer memory 216 may temporarily store the data to be recorded in the non-volatile memory 220 or the data to be read from the non-volatile memory 220. The buffer memory 216 may be configured to be provided inside the storage controller 210, but may be placed outside the storage controller 210.

The ECC engine 217 may perform error detection and correction functions of the read data that is read from the non-volatile memory 220. More specifically, the ECC engine 217 may generate parity bits for the write data to be written on the non-volatile memory 220, and the parity bits generated in this way may be stored in the non-volatile memory 220 together with the write data. When reading the data from the non-volatile memory 220, the ECC engine 217 may correct an error of the read data and output the read data with a corrected error, using the parity bits read from the non-volatile memory 220 together with the read data.

The AES engine 218 may execute at least one of the encryption and decryption operations of the data which is input to the storage controller 210, using a symmetric-key algorithm.

Figure 2:
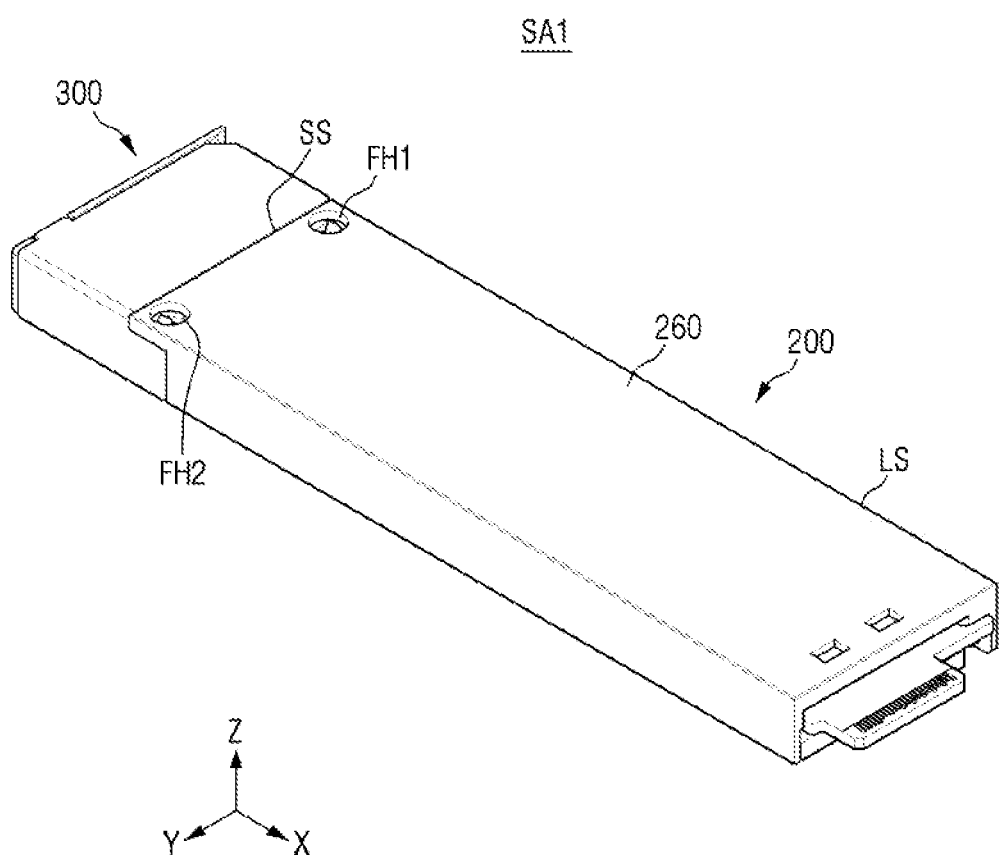
FIG. 2 is a perspective view of a storage assembly according to some embodiments.
Figure 3:
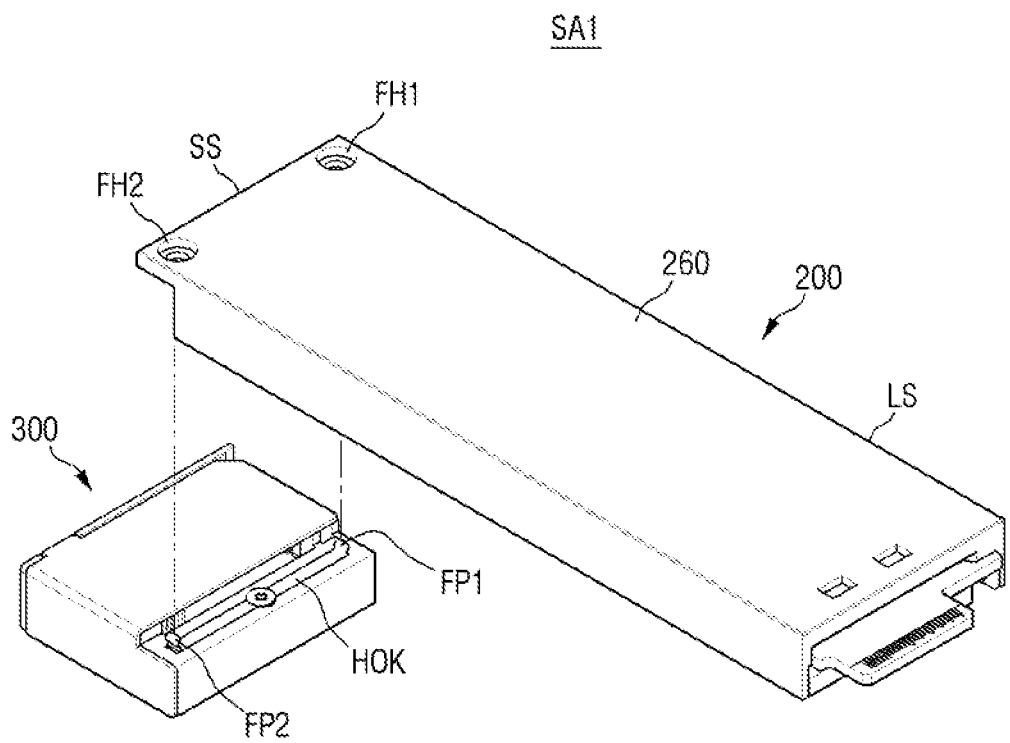
FIG. 3 is an exploded perspective view of the storage assembly of FIG. 2.

FIG. 2 is a perspective view of a storage assembly according to some embodiments. FIG. 3 is an exploded perspective view of the storage assembly of FIG. 2.

Referring to FIGS. 2 and 3, a storage assembly SA1 includes a storage device 200 and a latch assembly 300.

The storage device 200 may include an enclosure assembly 260. A first fixing hole FH1 and a second fixing hole FH2 may be formed in the enclosure assembly 260, and the enclosure assembly 260 may be joined to the latch assembly 300 through the first and second fixing holes FH1 and FH2.

Specifically, a hook HOK for joining with the storage device 200 may be placed on the latch assembly 300. The hook HOK may include a first joining part FP1 and a second joining part FP2. When the first and second joining parts FP1 and FP2 of the hook HOK are, for example, joined with the first and second fixing holes FH1 and FH2 of the enclosure assembly 260, respectively, by snap-fit, the storage device 200 and the latch assembly 300 may be joined.

In some embodiments, the shown storage device 200 and the latch assembly 300 may be attached to the host (100 of FIG. 1) in a joined state. A more specific description thereof will be provided later.

An appearance of the storage device 200 may have a substantially rectangular parallelepiped shape. In the storage device 200 illustrated in FIGS. 2-3, an extension direction of a long side LS of a bottom face, which has a rectangular shape, is indicated by a first direction X, an extension direction of a short side SS is indicated by a second direction Y, and a thickness direction of the rectangular parallelepiped is indicated by a third direction Z. Planes defined by the two directions may be called a XY plane, an YZ plane, and a ZX plane, respectively. With such a reference, the bottom face of the storage device 200 is placed on the XY plane. Unless otherwise specified herein, a planar shape or an appearance in a plan view of a particular member denotes a shape in which the particular member is placed in the XY plane.

For convenience of explanation, among the two bottom faces of the storage device 200, a face located on one side (an upper side in FIGS. 2-3) in the third direction Z is referred to as an upper face, and a face located on the other side (a lower side in FIGS. 2-3) in the third direction Z is referred to as a lower face, respectively. Furthermore, as for other components, on the basis of the third direction Z, a face located on one side will be referred to as an upper face, and a face located on the other side will be referred to as a lower face.

However, in the upper face and the lower face, the terms "upper" and "lower" only distinguish relative positions to each other, and it will be understood that, even in the case of those called "upper" and "lower", the faces may be upside down, or located in a left-right direction or a diagonal direction with a change of direction of the device 200.

The appearance of the storage device 200 may follow a standardized or arbitrary form factor. The dimensions of the rectangular parallelepiped storage device 200 may also be changed by various criteria.

In some embodiments, the storage device 200 may conform to a long type dimensional standard in which a long side length (a width in the first direction X) is 119 mm, a short side length (a width in the second direction Y) is 36.5 mm, and a height (a width in the third direction Z) is 9.5 mm. Further, in some other embodiments, the storage device 200 may conform to a short type dimensional standard in which a long side length (a width in the first direction X) is 52 mm, a short side length (a width in the second direction Y) is 36.5 mm, and a height (a width in the third direction Z) is 9.5 mm. Such a dimensional standard may allow tolerances within 5% of each dimension. For example, such a dimension standard may allow tolerances such as ±0.25 mm, ±0.35 mm and ±0.45 mm.

Hereinafter, a storage device 200 of a storage assembly SA1 according to some embodiments will be described referring to FIGS. 4 to 6.

Figure 4:
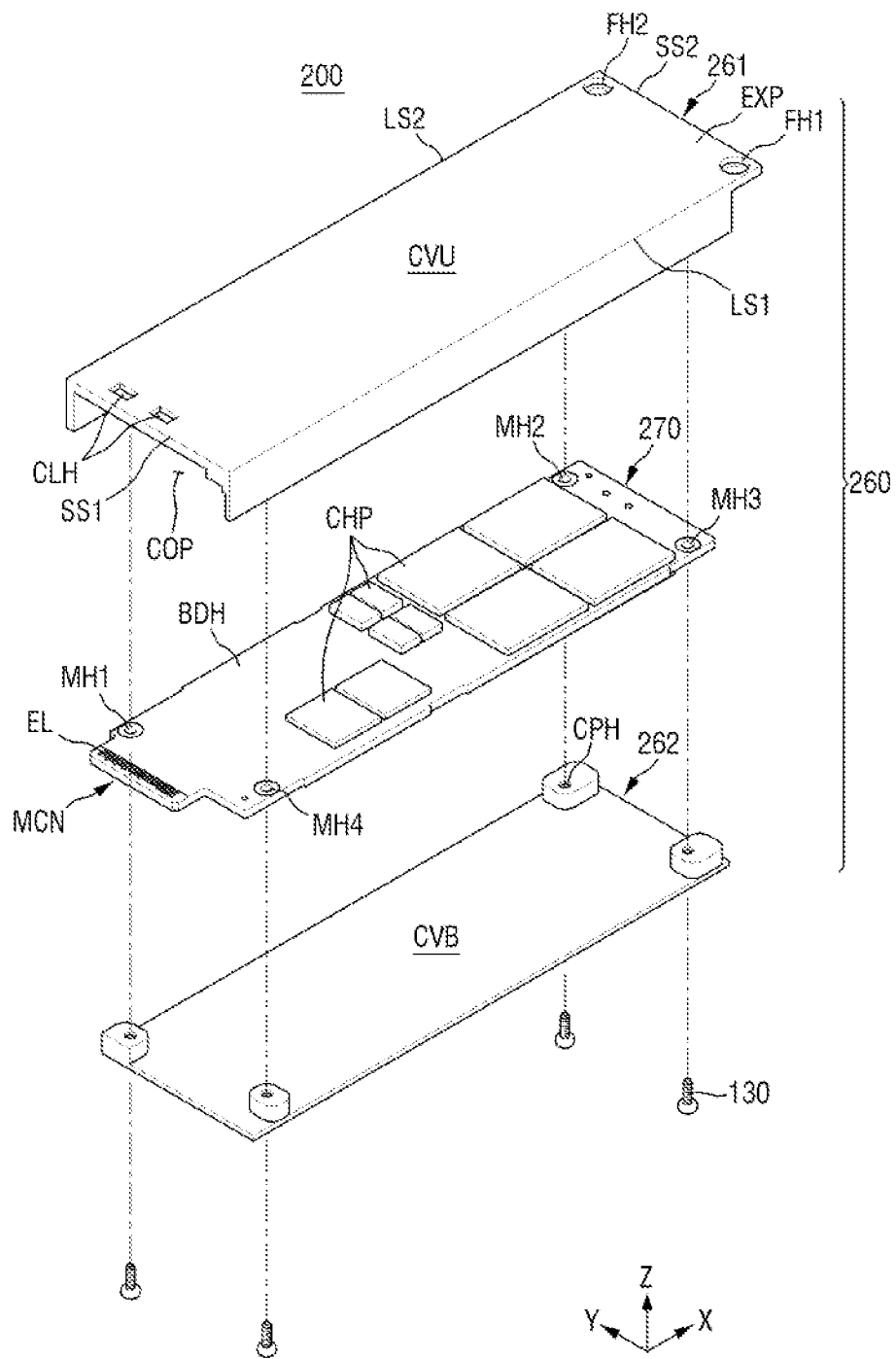
FIGS. 4 and 5 are exploded perspective views of a storage device of the storage assembly of FIG. 3, according to some embodiments.
Figure 5:
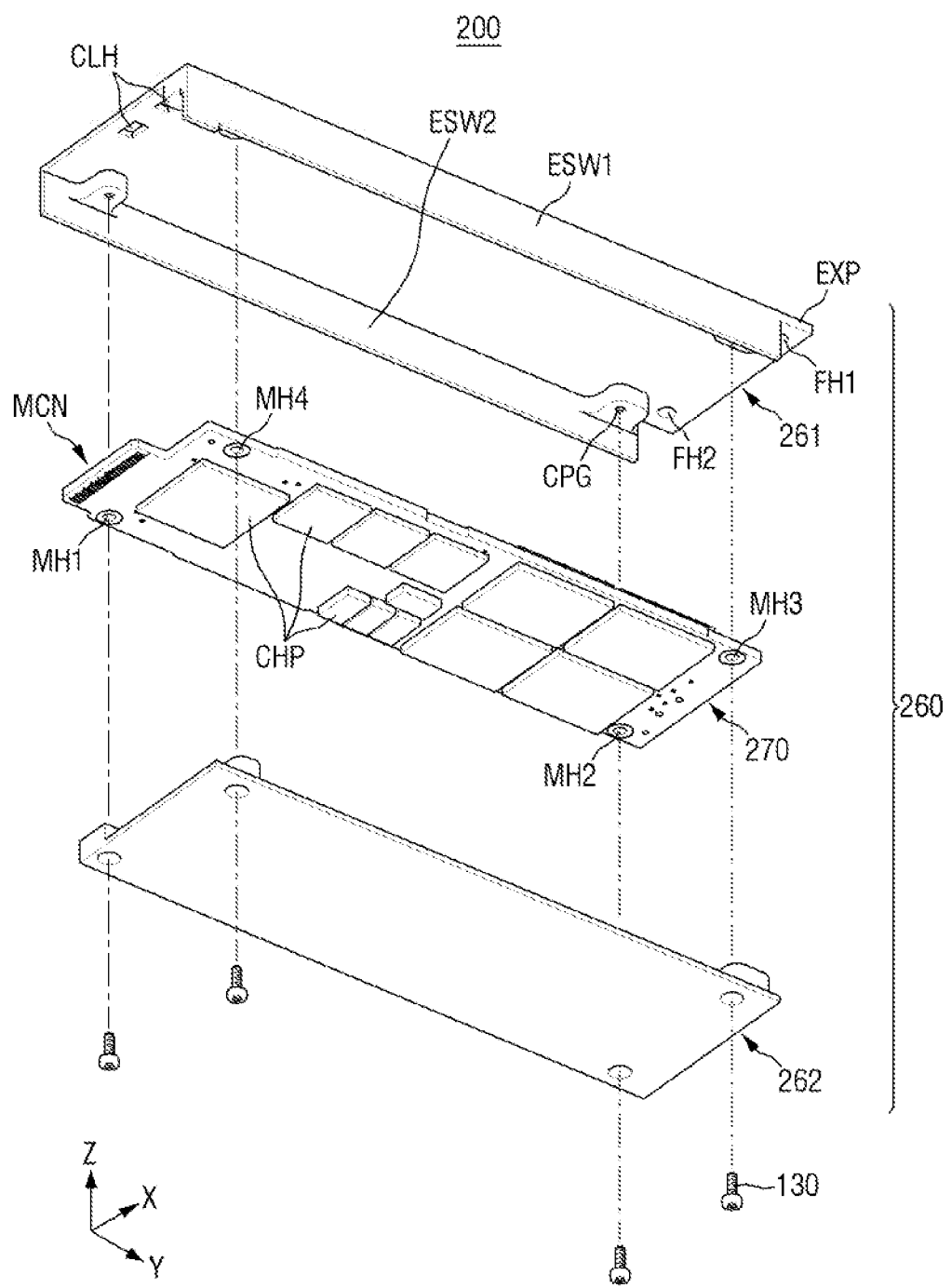

FIGS. 4 and 5 are exploded perspective views of the storage device of FIG. 3. FIG. 6 is an enlarged view of a fixing hole of the storage device.

Figure 6:
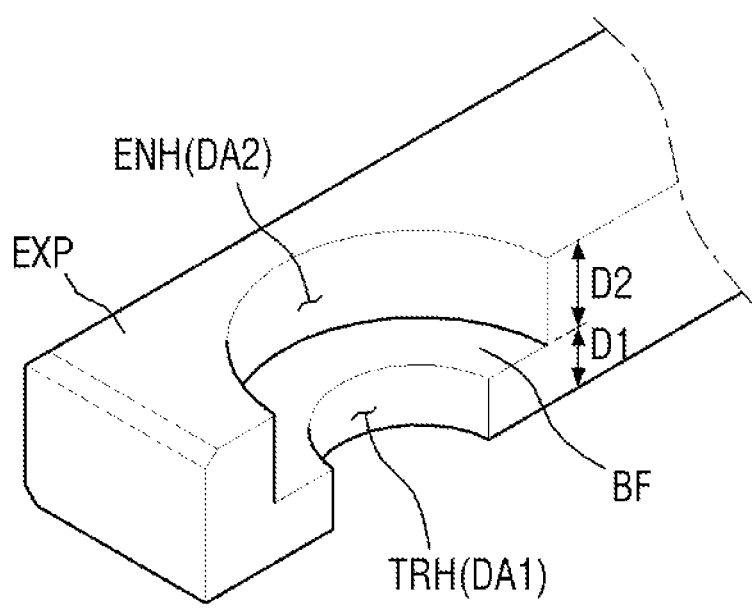
FIG. 6 is an enlarged view of a fixing hole of the storage device of FIGS. 4-5.

Referring to FIGS. 4 to 6, the storage device 200 includes a memory module 270, and the enclosure assembly 260 that stores the memory module 270. The enclosure assembly 260 may substantially define the appearance of the storage device 200. The memory module 270 may be covered with the enclosure assembly 260, except for some regions such as a region in which the memory connector MCN is located.

The memory module 270 may include a module board BDH, a memory connector MCN provided in at least one end of the module board BDH, and an electronic element CHP placed on at least one face of the module board BDH.

The module board BDH may include one or more insulating layers and wiring layers. The module board BDH may include, for example, a printed circuit board.

The module board BDH may have a plate-like shape. The module board BDH may be placed approximately on the XY plane. An overall planar shape of the module board BDH may be similar to a planar shape of the storage device 200. For example, when the storage device 200 has a rectangular or similar appearance in the plan view, the module board BDH may also have a rectangular or similar appearance.

In the plan view, the size of the module board BDH is smaller than the size of the storage device 200, but may be approximated to the storage device 200. For example, in the area occupied by the storage device 200, an area occupied by the module board BDH may be in the range of 50% to 99%.

In the plan view, the module board BDH occupies the central part of the storage device 200, and each side of the module board BDH may be located inside from each corresponding side of the storage device 200. Except for some sections, the enclosure assembly 260 is placed in a space between each side of the module board BDH and each side of the storage device 200 to prevent exposure of the module board BDH to outside.

The module board BDH may include one or more module fastening holes MH1 to MH4. In a configuration in which there are multiple module fastening holes MH1 to MH4, each of the module fastening holes MH1 to MH4 may have the same size and shape, but embodiments are not limited thereto.

The module fastening holes MH1 to MH4 penetrate the module board BDH in the third direction Z (a thickness direction). The module fastening holes MH1 to MH4 provide a space into which fastening members such as screws, pieces and bolts are inserted. Hereinafter, although a screw is shown as an example of the fastening member, it will be understood that various members that are inserted into holes or grooves and joined may be equally applied in the manner similar to the screw.

The module fastening holes MH1 to MH4 may be placed at the corners of the module board BDH. The module fastening holes MH1 to MH4 may include a first module fastening hole MH1 placed at a first corner, a second module fastening hole MH2 placed at a second corner, a third module fastening hole MH3 placed at a third corner, and a fourth module fastening hole MH3 placed at a fourth corner. However, embodiments are not limited thereto, and the module fastening holes MH1 to MH4 may be omitted at some corners, may be further installed in regions (e.g., a central part and a region adjacent to the side) other than the corners.

In some embodiments, the positions of each of the module fastening holes MH1 to MH4 may be configured so that the distances separated in the first direction X are the same as the distances separated in the second direction Y on the basis of the corners of each corner to provide efficient joining. In such an embodiment, if each corner of the module board BDH is located at the apex of a rectangle, the figure formed by connecting each of the module fastening holes MH1 to MH4 will define a rectangle.

In some other embodiments, each of the module fastening holes MH1 to MH4 may be deformed from the aforementioned positions, depending on the wiring design of the module board BDH, the chip placement, the position of the memory connector MCN or the like. For example, as shown in FIGS. 4-6, when the memory connector MCN is located on the first short side SS1, and placed to be generally biased to the second long side LS2 further than the first long side LS1, the fourth module fastening hole MH4 may be located to be farther away from the first short side SS1 in the first direction X than the first module fastening hole MH1. In this case, a straight line which connects the first module fastening hole MH1 and the fourth module fastening hole MH4 may be inclined at a first angle with respect to the second direction Y.

In the case of a second module fastening hole MH2 and a third module fastening hole MH3 located near the second short side SS2 on which the memory connector MCN is not located, spaced distances from the second short side SS2 in the first direction X may be the same. However, by configuring the spaced distance of the second module fastening hole MH2 to be greater than the spaced distance of the third module fastening hole MH3, it is possible to alleviate the spaced distance deviation in the first direction X between the module fastening holes MH1 to MH4. In this case, the straight line which connects the second module fastening hole MH2 and the third module fastening hole MH3 may be inclined at a second angle with respect to the second direction Y. The second angle may have the same sign as the first angle. The second angle may have a smaller absolute value than the first angle, but embodiments are not limited thereto. In some embodiments, the figure obtained by connecting each of the module fastening holes MH1 to MH4 may define a trapezoid.

The module fastening holes MH1 to MH4 may have a closed curved shape such as a circular shape in the plan view. In this case, the module fastening holes MH1 to MH4 may be completely surrounded by the module board BDH in the plan view. In some embodiments, some of the module fastening holes MH1 to MH4 may be opened toward the side (e.g., the long side) of the module board BDH. That is, because the module fastening holes MH1 to MH4 are placed to be closer to the sides of the module board BDH, and the side of the module board BDH is placed inside a virtual circle formed by the module fastening holes MH1 to MH4, the module fastening holes MH1 to MH4 do not complete a circular closed curve shape and may be opened horizontally to the side of the module board BDH. In this case, the width opened toward the side of the module board BDH may be smaller than the diameter of the virtual circular shape.

The memory connector MCN may be placed at one end portion of the module board BDH. Although FIGS. 4-6 show a case where the memory connector MCN is connected to the first short side SS1 of the module board BDH and protrudes from the first short side SS1 of the module board BDH to the outside in the first direction X, embodiments are not limited thereto, the memory connector MCN may be placed on another side or may be placed on a plurality of sides.

In some embodiments, the width of the memory connector MCN in the second direction Y may be smaller than the width of the module board BDH in the second direction Y. Further, the memory connector MCN may be placed apart from an extension line of the first long side LS1 and/or an extension line of the second long side LS2 of the module board BDH. The memory connector MCN may be placed to be generally biased to the second long side LS2 further than the first long side LS1. That is, a distance between the memory connector MCN and the extension line of the first long side LS1 of the module board BDH may be greater than a distance between the memory connector MCN and the extension line of the second long side LS2 of the module board BDH. However, embodiments are not limited thereto, and in some embodiments the memory connector MCN may be located at an equal distance from the long sides of the module board BDH.

The memory connector MCN may be connected to the module board BDH. That is, in some embodiments, the memory connector MCN may be provided as a separate member from the module board BDH and attached to the module board BDH, but embodiments are not limited thereto and in other embodiments, the memory connector MCN may be provided integrally with the module board BDH. When the memory connector MCN is provided integrally with the module board BDH, the memory connector MCN may be provided in a module board BDH protruding region formed by outward protrusion of a part of the module board BDH.

The memory connector MCN may include a plurality of connection terminals EL. The plurality of connection terminals EL may be placed to be spaced apart from each other along the second direction Y. Each connection terminal EL of the memory connector MCN may be connected to each connection terminal (176 of FIG. 11) of the corresponding host connector (HCO of FIG. 11). A detailed explanation of the connection between the memory connector MCN and the host connector (HCO of FIG. 11) will be provided later.

Each connection terminal EL of the memory connector MCN may be connected to the wiring of the module board BDH. If the memory connector MCN is provided integrally with the module board BDH, the connection terminal EL of the memory connector MCN may be formed on the same layer, using the same material as the wiring of the module board BDH. Each connection terminal EL may have the shape of a pad electrode that has a width wider than the wiring of the module board BDH. The plurality of connection terminals EL may be exposed to the outside, while being at least partially uncovered with an insulating layer.

The plurality of connection terminals EL may be placed on the upper face of the memory connector MCN, or may be placed on the lower face. In some cases, the plurality of connection terminals EL may be placed on both the upper and lower faces of the memory connector MCN. Furthermore, the memory connector MCN includes a plurality of layers separated in the thickness direction, and a plurality of connection terminals EL may be placed on at least one face of each layer.

The size, shape and position of the memory connector MCN described above, the arrangement of the connection terminals EL, and the like may conform to a defined standard. For example, the size, shape and position of the memory connector MCN, the arrangement of the connection terminals EL, and the like may correspond to standards such as E1.S, M.2, and NF2 Standards.

Electronic elements CHP are placed on the upper face and/or the lower face of the module board BDH. The electronic elements CHP may be fabricated in a chip form separate from the module board BDH and mounted on the module board BDH.

The electronic element CHP may include a semiconductor element. The semiconductor element may include a memory such as a NAND flash memory or a DRAM memory, and a memory controller that controls the memory. In some embodiments, the storage controller 210, the host interface 211, the memory interface 212, the CPU 213, the buffer memory 216, and the like shown in FIG. 1 may be manufactured in the form of such electronic elements CHP and mounted on the module board BDH. In some embodiments, the electronic element CHP may further include a capacitor element. Each electronic element CHP may be connected to the wiring of the module board BDH to perform an electrical operation. The plurality of electronic elements CHP may be spaced apart from each other. A horizontal gap may be defined in the spaced space between the respective electronic elements CHP. The horizontal gap may be filled with air or the like.

The enclosure assembly 260 generally has a rectangular parallelepiped shape with an empty interior. The memory module 270 is stored inside the enclosure assembly 260. The enclosure assembly 260 may act as a housing.

The enclosure assembly 260 may include an upper face, a lower face, and side faces in an appearance. The upper and lower faces of the enclosure assembly 260 may form the upper and lower faces of the storage device 200, and each of the side faces may form the side face of storage device 200. At a location corresponding to one side face of the storage device 200, the enclosure assembly 260 may include a connector opening COP that exposes the memory connector MCN in the first direction X.

The enclosure assembly 260 may be provided by assembling a plurality of components. Specifically, the enclosure assembly 260 may include a first enclosure 261 located at the top and a second enclosure 262 located at the bottom. The first enclosure 261 and the second enclosure 262 may be fastened together to define a space that is at least partially sealed. The memory module 270 may be stored in the sealed space.

The first enclosure 261 and the second enclosure 262 may each be made of a metal such as stainless steel, aluminum (Al), copper (Cu), titanium (Ti), nickel (Ni), or an alloy containing stainless steel, aluminum (Al), copper (Cu), titanium (Ti), nickel (Ni), or may be made up of a polymer material, a carbon-based material or a composite material thereof.

In some embodiments, the first enclosure 261 and the second enclosure 262 may include a thermal interface material (TIM), a phase change material (PCM) or an encapsulated PCM (ePCM). Such materials may be mixed with the constituent materials of the first enclosure 261 and the second enclosure 262, and may also be coated on the inner face (the lower face in the case of the first enclosure 261, and the upper face in the case of the second enclosure 262) of the first enclosure 261 and the second enclosure 262, or on both faces. Further, the materials may be fabricated of another film or the like and attached to the inner side face or both faces of the first enclosure 261 and the second enclosure 262.

The thermal interface material or the like may help the first enclosure 261 and the second enclosure 262 to absorb, store, and spread heat. It is possible to increase the thermal capacity of the enclosure assembly 260 and the storage device 200 including the same accordingly. In some embodiments, the materials of the first enclosure 261 and the second enclosure 262 may be the same or may be different.

The first enclosure 261 includes a top plate CVU which is a top cover, and first and second side walls ESW1 and ESW2 which are side covers.

The top plate CVU is placed on the XY plane. The top plate CVU may have a uniform thickness.

The top plate CVU may have a substantially rectangular shape in the plan view. The planar shape of the top plate CVU may be substantially the same as the planar shape of the storage device 200. The lengths of the long and short sides of the storage device 200 each may be determined by the lengths of the long and short sides of the top plate CVU.

The top plate CVU may cover not only the module board BDH of the memory module 270 but also the memory connector MCN of the memory module 270. The first short side SS1 of the top plate CVU may be aligned with the end portion of the memory connector MCN or may be placed outside the end portion.

The first side wall ESW1 and the second side wall ESW2 may be connected to the top plate CVU and formed integrally. The first side wall ESW1 may be bent from the first long side LS1 of the top plate CVU and extend in the third direction Z, and the second side wall ESW2 may be bent from the second long side LS2 of the top plate CVU and extend in the third direction Z. There may be no side wall to define a connector opening COP on the first short side SS1 side of the top plate CVU.

Although the first side wall ESW1 and the second side wall ESW2 may have the same thickness, and may have the same thickness as the top plate CVU, embodiments are not limited thereto.

The first side wall ESW1 and the second side wall ESW2 may have a height corresponding to the height of the storage device 200. The heights of the first side wall ESW1 and the second side wall ESW2 may be generally the same.

The first enclosure 261 may include a joining groove CPG that is spatially connected to the module fastening holes MH1 to MH4 and fastened by the module screw 130. The joining grooves CPG of the first enclosure 261 may be placed in the same number as the module fastening holes MH1 to MH4. The joining groove CPG of the first enclosure 261 may overlap the corresponding module fastening holes MH1 to MH4. Although the planar shapes of the joining groove CPG of the first enclosure 261 and the module fastening holes MH1 to MH4 may be the same, embodiments are not limited thereto.

The top plate CVU of the first enclosure 261 includes an extension EXP extending in the first direction X beyond one end of each of the first side wall ESW1 and the second side wall ESW2. Due to the extension EXP, the top plate CVU may further extend in the first direction X beyond the first side wall ESW1 and the second side wall ESW2.

The first and second fixing holes FH1 and FH2 may be formed in the extension EXP for joining with the latch assembly (300 of FIG. 3) described above.

Referring to FIG. 6, each of the first and second fixing holes FH1 and FH2 may include a through hole TRH located at the central part on the basis of the third direction Z, and an extension hole ENH that is located above the through hole TRH and surrounds the through hole TRH. The through hole TRH and the extension hole ENH may be spatially connected to each other. In other words, the through hole TRH and the extension hole ENH may be coaxial, with the through hole TRH being located at a center of the extension hole ENH and thus at a center of the fixing hole.

The through hole TRH and the extension hole ENH may each have a circular shape in the plan view. The extension hole ENH has an inner diameter larger than that of the through hole TRH, and the through hole TRH may be placed inside the extension hole ENH in the plan view. The planar shape of the through hole TRH and the planar shape of the extension hole ENH may be in a concentric relationship.

In some embodiments, an inner diameter DA1 of the through hole TRH may be 2.6 mm to 2.8 mm. A depth D1 of the through hole TRH may be 0.9 mm to 1.1 mm. In some embodiments, an inner diameter DA2 of the extension hole ENH may be 4.6 mm to 4.8 mm. Further, a depth D2 of the extension hole ENH may be 1.1 mm to 1.3 mm. However, embodiments are not limited thereto.

At a boundary between the through hole TRH and the extension hole ENH, the extension hole ENH may include a bottom face BF (i.e., a connecting portion connecting an inner wall of the through hole TRH to an inner wall of the extension hole ENH) placed on the XY plane. The bottom face BF of the extension hole ENH may serve as a settling face on which the hook (HOK of FIG. 3) of the latch assembly (300 of FIG. 3) is settled as described later.

Each of the first and second fixing holes FH1 and FH2 having such a structure may contribute to easily attaching and detaching the storage device 200 and the latch assembly (300 of FIG. 3). As mentioned above, since the joining part (FP1, FP2 of FIG. 3) of the hook (HOK of FIG. 3) penetrating the through hole TRH is settled on the bottom face BF of the extension hole ENH, it is possible to improve the easiness of attachment and detachment and also improve reliability of joining. More specific description thereof will be provided later.

The first enclosure 261 may further include at least one clamping hole CLH penetrating the top plate CVU. The clamping hole CLH provides a space for inserting the hook (171 of FIG. 10) of the host connector (HCO of FIG. 10) when connected to the host connector (HCO of FIG. 10) to be described later. The clamping hole CLH may be placed to be adjacent to the first short side SS1 of the top plate CVU.

The clamping hole CLH may be placed at a position overlapping the memory connector MCN. The clamping hole CLH may have a rectangular shape with a long side in the second direction Y in the plan view. In some embodiments, the width of the clamping hole CLH in the second direction Y may be 4.0 mm, and the width thereof in the first direction X may be 2.5 mm. However, embodiments are not limited thereto.

The number of clamping holes CLH may correspond to the number of hooks (171 of FIG. 10) of the host connector (HCO of FIG. 10) to be described later. For example, if the host connector (HCO of FIG. 10) includes two hooks (171 of FIG. 10), the number of clamping holes CLH may also be two. However, this is only an example and in some embodiments, the number of clamping holes CLH and the number of hooks may be one or may be more than two. The plurality of clamping holes CLH may be arranged along the second direction Y.

In some embodiments, one clamping hole CLH may be placed to be spaced by 7.25 mm from the second long side LS2 of the top plate CVU, and the other one clamping hole CLH may be placed to be spaced by 16.25 mm from the second long side LS2. An interval between the clamping holes CLH may be 5.0 mm.

The second enclosure 262 includes a bottom plate CVB which is a bottom cover.

The bottom plate CVB is placed on the XY plane. Although the bottom plate CVB may have the same thickness as the top plate CVU, embodiments are not limited thereto.

The bottom plate CVB may have an area smaller than the top plate CVU. The bottom plate CVB covers the entire module board BDH of the memory module 270 from below, but may not cover and expose the memory connector MCN. The first short side SS1 of the bottom plate CVB is located inside the first short side SS1 of the top plate CVU and may be located inside the end portion of the memory connector MCN. Although the first short side SS1 of the top plate CVU may be aligned with the first short side SS1 of the module board BDH, embodiments are not limited thereto.

The second enclosure 262 may include joining holes CPH that are spatially connected to the module fastening holes MH1 to MH4 and fastened by the module screws 130. The number of joining holes CPH of the second enclosure 262 may be placed in the same number as that of the module fastening holes MH1 to MH4. The joining hole CPH of the second enclosure 262 may overlap the corresponding module fastening holes MH1 to MH4 and the joining groove CPG of the first enclosure 261. Although the planar shapes of the joining hole CPH of the second enclosure 262 and the module fastening holes MH1 to MH4 may be the same, embodiments are not limited thereto.

The first enclosure 261, the memory module 270 and the second enclosure 262 may be fastened to each other by the module screws 130, each including a screw body and a screw head. Each module screw 130 sequentially passes through the corresponding joining hole CPH of the second enclosure 262 and the corresponding one of the module fastening holes MH1 to MH4 from the lower face of the second enclosure 262, and is inserted into the corresponding joining groove CPG of the first enclosure 261 to join the first enclosure 261, the memory module 270 and the second enclosure 262 together. Spirals that rotate in the same direction may be placed on the inner walls of the joining hole CPH of the second enclosure 262, the module fastening holes MH1 to MH4 and/or the joining groove CPG of the first enclosure 261 to facilitate joining due to the module screw 130. In the fastened storage device 200, the head of the module screw 130 may be placed below a surface of the second enclosure 262, and/or may be placed inside the joining hole CPH of the second enclosure 262.

Hereinafter, the latch assembly 300 of the storage assembly SA1 of FIGS. 2-3, according to some embodiments, will be described referring to FIGS. 7 and 8.

Figure 7:
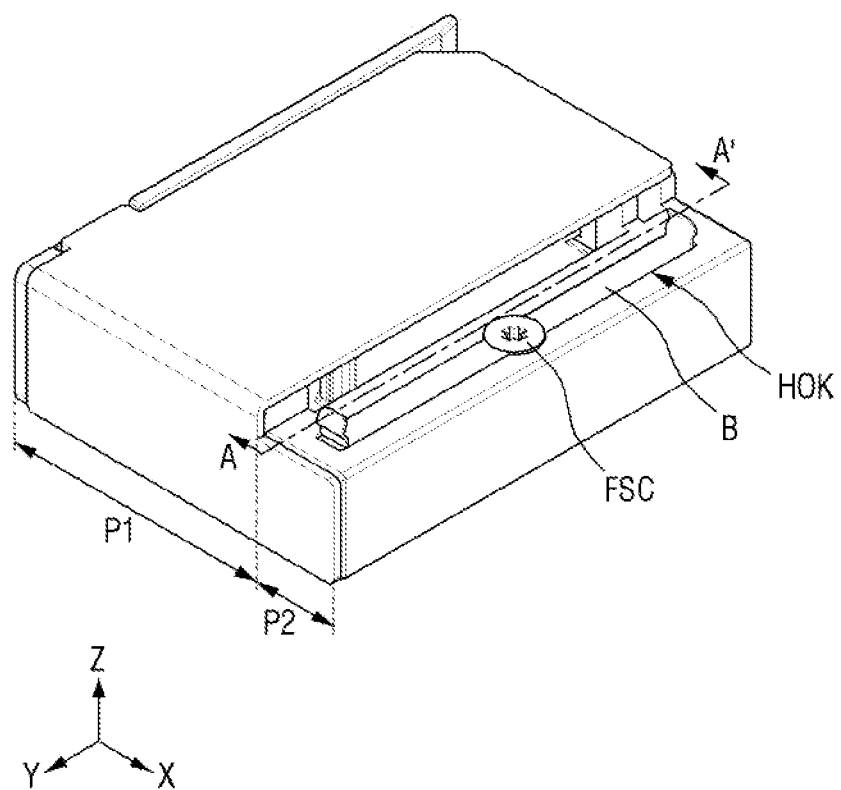
FIG. 7 is a perspective view of a latch assembly of the storage assembly of FIG. 3, according to some embodiments.

FIG. 7 is a perspective view of the latch assembly of FIG. 3. FIG. 8 is a cross-sectional view taken along a line A-A' of FIG. 7.

Figure 8:
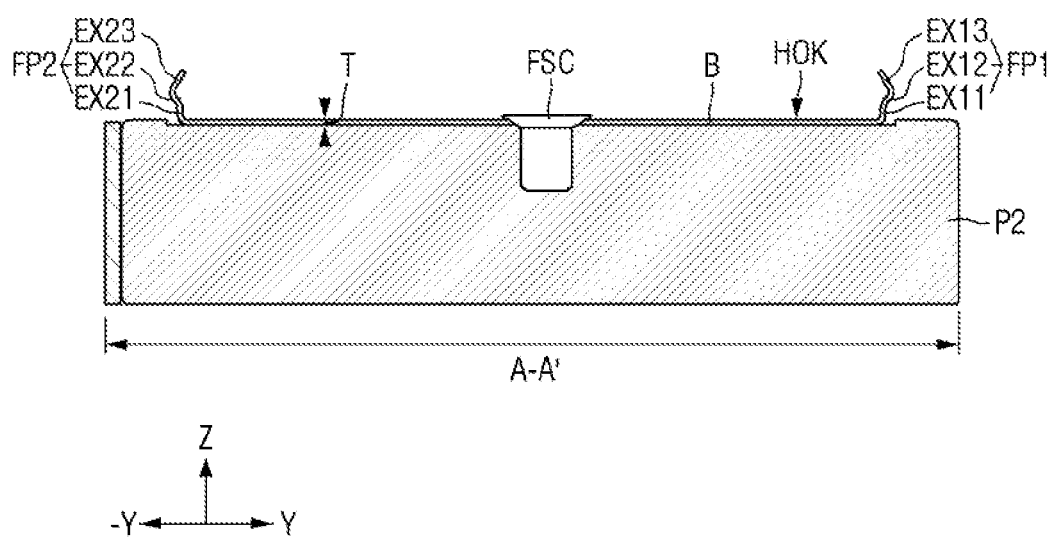
FIG. 8 is a cross-sectional view taken along a line A-A' of FIG. 7.

Referring to FIGS. 7 and 8, the latch assembly 300 may a body including a first part P1 and a second part P2.

The second part P2 may be placed to extend from the first part P1 in the first direction X. As shown, an upper face of the second part P2 may be lower than an upper face of the first part P1. That is, the first part P1 and the second part P2 may form a step shape and be connected to each other.

The hook HOK may be placed on the upper face of the second part P2. In some embodiments, the hook HOK may be fixed to the upper face of the second part P2 using a fixing screw FSC, but embodiments are not limited thereto. In some embodiments, the hook HOK may also be fixed to the upper face of the second part P2 using, for example, an adhesive or the like.

Although FIG. 7 shows that the hook HOK is fixed to the upper face of the second part P2 using a single fixing screw FDC, embodiments are not limited thereto. In some embodiments, the fixing screw FDC may be provided in plural and the number of fixing screws FDC for fixing the hook HOK to the upper face of the second part P2 may be variously modified and embodied.

The hook HOK may have elasticity. As used in this specification, the expression "having elasticity" denotes that, when external pressure is applied to the hook HOK, a resilience against the external pressure is applied In other words, the hook HOK resists the external pressure. In some embodiments, the hook HOK may be a metal made of stainless steel and may be manufactured by a pressing method, a die casting method, an injection method, or the like. However, embodiments are not limited thereto.

The hook HOK may have the first and second joining parts FP1 and FP2, as described above. The first joining part FP1 may be formed at a first end portion of the hook HOK and the second joining part FP2 may be formed at a second end portion of the hook HOK. The first end portion may be opposite to the second end portion (i.e., the first and second end portions may be at opposite sides of the hook HOK). The first joining part FP1 may be bent over the upper face of the second part P2 (for example, in the Z direction) the second joining part FP2 may be bent over the upper face of the second part P2 (e.g., in the Z direction). In other words, the first joining part FP1 may be bent away from the upper face of the second part P2 and the second joining part FP2 may be bent away from the upper face of the second part P2.

When the storage device (200 of FIG. 3) and the latch assembly (300 of FIG. 3) are joined, the first joining part FP1 may be inserted and accommodated inside the first fixing hole FH1, and the second joining part FP2 may be inserted and accommodated inside the second fixing hole FH2.

The first joining part FP1 may include a first extension EX11 that is bent and extends in the third direction Z from the body B of the hook HOK, a second extension EX12 that is bent and extends in the second direction +Y from the first extension EX11, and a third extension EX13 that is bent and extends in the second direction −Y from the second extension EX12. The second joining part FP2 may include a fourth extension EX21 that is bent and extends in the third direction Z from the body B of the hook HOK, a fifth extension EX22 that is bent and extends in the second direction −Y from the fourth extension EX21, and a sixth extension EX23 that is bent and extends in the second direction +Y from the fifth extension EX22.

The shapes of the first joining part FP1 and the second joining part FP2 are configured to improve the joining reliability between the storage device (200 of FIG. 3) and the latch assembly (300 of FIG. 3) when the storage device (200 of FIG. 3) and the latch assembly (300 of FIG. 3) are joined.

In some embodiments, a thickness T of the hook HOK may be between 0.1 mm and 0.5 mm. As a result, the thickness T of the first joining part FP1 and the second joining part FP2 may also be 0.1 mm to 0.5 mm. In other words, the thickness T of the metal of the hook HOK may be between 0.1 mm and 0.5 mm, and in some embodiments, the thickness T of the metal of the hook HOK may be substantially uniform over the hook HOK such that the thickness T of the metal of the first joining part FP1 and of the metal of the second joining part FP2 may also be 0.1 mm to 0.5 mm. More specific description thereof will be provided later.

Figure 9:
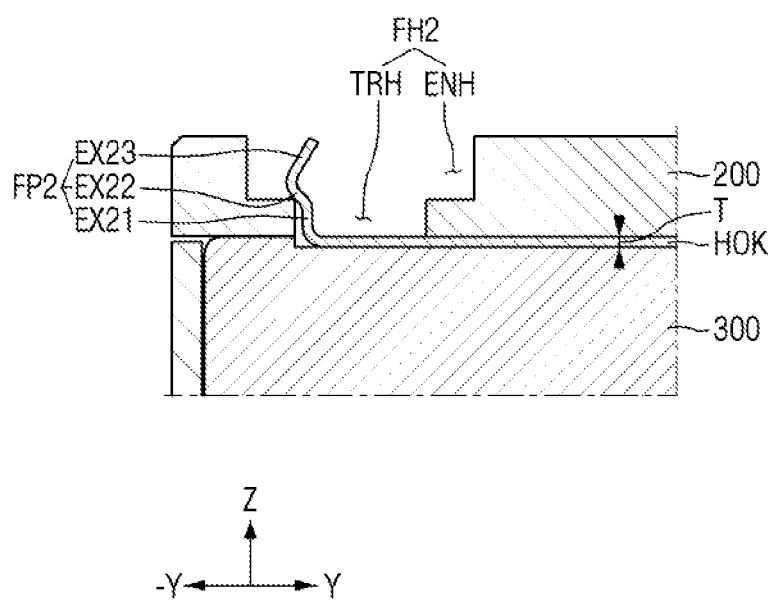
FIG. 9 is a diagram showing a form in which a hook of the latch assembly of FIG. 7 is inserted and accommodated to the fixing hole of the storage device.

FIG. 9 is a diagram showing a form in which the hook of the latch assembly is inserted and accommodated to the fixing hole of the storage device. FIG. 9 illustrates the second fixing hole FH2 and the second joining part FP2 by way of example.

Referring to FIG. 9, the second fixing hole FH2 may include the through hole TRH and the extension hole ENH. The second joining part FP2 may include the fourth to sixth extensions EX21 to EX23. Since the second fixing hole FH2 and the second joining part FP2 are fully described above, repeated detailed explanation will not be provided for conciseness.

When the storage device 200 is joined to the latch assembly 300, the second joining part FP2 may penetrate the through hole TRH. Further, the extension hole ENH may accommodate one end of the second joining part FP2 (for example, the sixth extension EX23) therein.

Specifically, the fourth extension EX21 penetrates the through hole TRH, and the fifth extension EX22 extends from the fourth extension EX21 toward the inner wall of the extension hole ENH, and the sixth extension EX23 extends from the fifth extension EX22 toward the center of the extension hole ENH.

In some embodiments, the fifth extension EX22, which is bent and extends in the second direction −Y from the fourth extension EX21, may come into contact with the inner wall of the through hole TRH as shown. Additionally, in some embodiments, the fifth extension EX22 may also be in contact with the lower face of the extension hole ENH.

Although only the second fixing hole FH2 and the second joining part FP2 are shown in FIG. 9, the explanation may be equally applied to the first fixing hole FH1 and the first joining part FP1 and thus a repeated description thereof is omitted for conciseness.

As mentioned above, since the hook HOK has elasticity, the storage device 200 may be attached to the latch assembly 300 by making the fifth extension EX22 and the sixth extension EX23 penetrate the through hole TRH in the state of applying a force to the fifth extension EX22 and the sixth extension EX23 in the second direction +Y and by making the second extension EX12 and the third extension EX13 of the first joining part FP1 penetrate the through hole TRH on the opposite side in the state of applying a force to the second extension EX12 and the third extension EX13 in the second direction −Y. After that, since the fifth extension EX22 exerts a force on the inner wall of the through hole TRH and/or the lower face of the extension hole ENH in the second direction −Y by elasticity and the second extension EX12 exerts a force on the inner wall of the through hole TRH and/or the lower face of the extension hole ENH on the other side in the second direction +Y by elasticity, the latch assembly 300 and the storage device 200 may be firmly fixed. The joining reliability between the storage device 200 and the latch assembly 300 may be improved accordingly.

On the other hand, when the latch assembly 300 is detached from the storage device 200, if a force is applied to the fifth extension EX22 and the sixth extension EX23 in the second direction +Y and a force is applied to the second extension EX12 and the third extension EX13 in the second direction −Y, since there is a state in which the fifth extension EX22 and the sixth extension EX23 may pass through the through hole TRH and the second extension EX12 and the third extension EX13 may pass through the through hole TRH on the opposite side, the latch assembly 300 may be easily detached from the storage device 200. Therefore, attachment and detachment may be more easily performed than the configuration in which the storage device 200 and the latch assembly 300 are attached and detached using, for example, a screw or the like.

As described above, in some embodiments, the thickness T of the hook HOK may be between 0.1 mm and 0.5 mm. By maintaining the thickness T of the hook HOK to be 0.1 mm or more, the proper elasticity of the hook HOK when attaching and detaching may be maintained. By maintaining the thickness T of the hook HOK to be 0.5 mm or less, when the storage device 200 is attached to the latch assembly 300, it is possible to prevent the lower face of the storage device 200 from excessively rising from the upper face of the latch assembly 300.

Hereinafter, the process of attaching the storage device 200 and the latch assembly 300 to the host (100 of FIG. 1) will be described referring to FIGS. 10 to 12.

Figure 10:
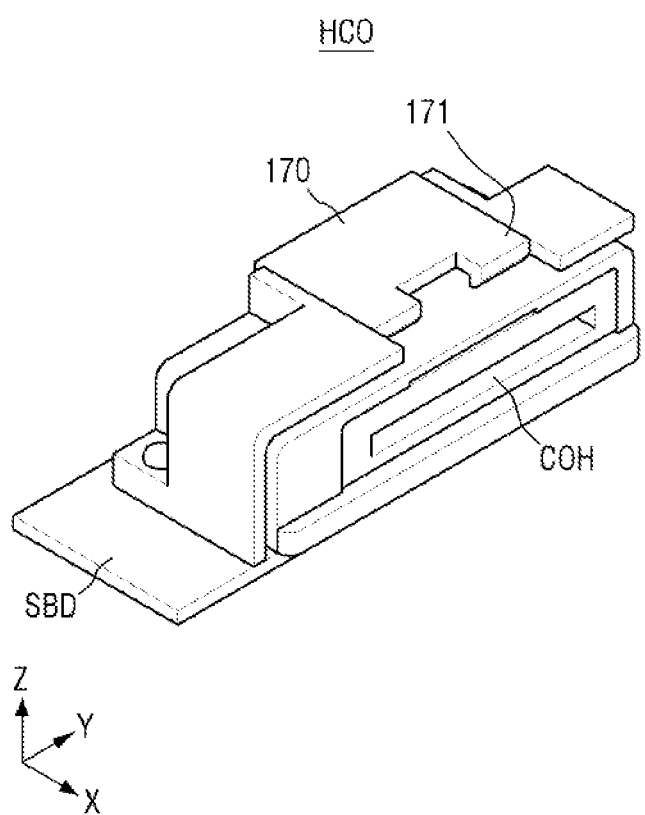
FIG. 10 is a partial perspective view of a host of the host storage system of FIG. 1, according to some embodiments.

FIG. 10 is a partial perspective view of a host of the host storage system of FIG. 1, according to some embodiments. FIG. 11 is a cross-sectional view of FIG. 10. FIG. 12 is a partial perspective view of the storage device of FIGS. 2-3.

Figure 11:
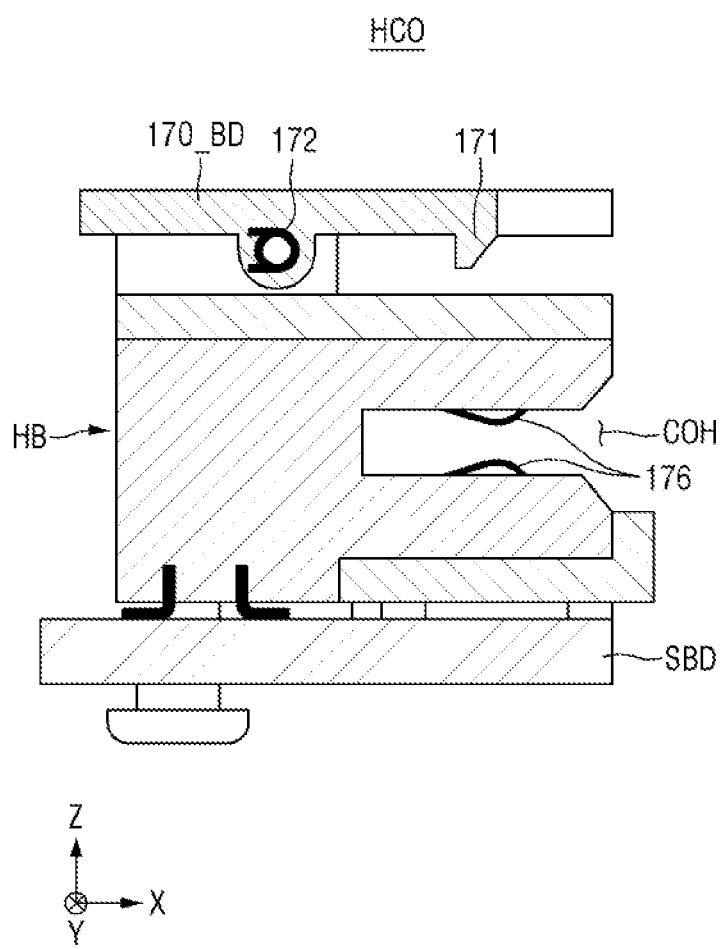
FIG. 11 is a cross-sectional view of FIG. 10.
Figure 12:
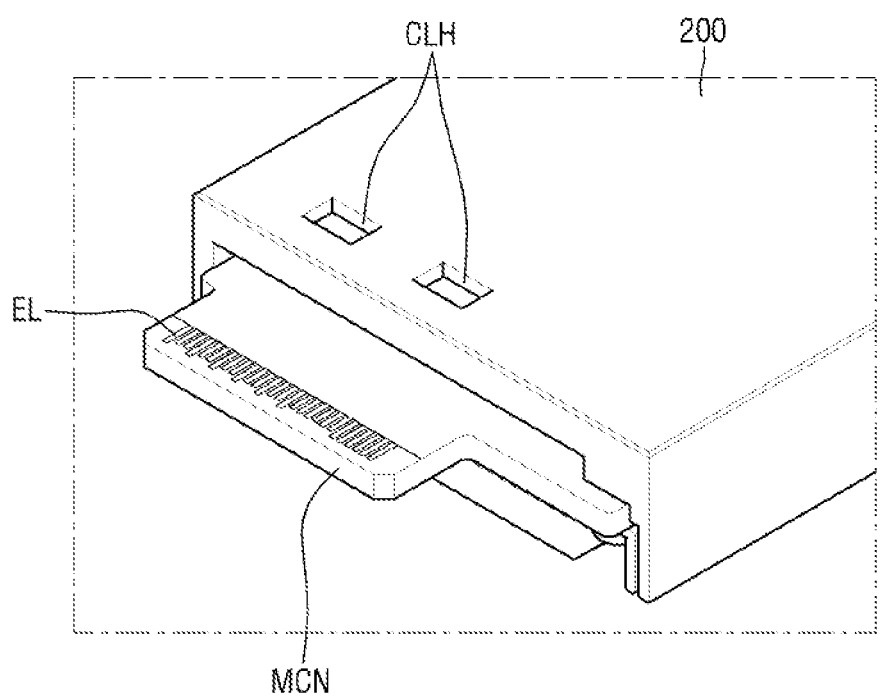
FIG. 12 is a partial perspective view of the storage device of the storage assembly of FIGS. 2-3.

Referring to FIGS. 10 to 12, the host (100 of FIG. 1) may include a host connector HCO and a system board SBD.

The system board SBD may include a printed circuit board PCB. The host connector HCO may be fixed to the system board SBD. Although FIGS. 10-11 shows a shape in which the host connector HCO is fixed to the system board SBD through a screw, the fixing method thereof is not limited to those exemplified. For example, in some embodiments, the host connector HCO and the system board SBD may be electrically connected.

The host connector HCO may include a connector body HB, a plurality of connection terminals 176 installed inside the connector body HB, and a latch 170 installed on the upper face of the connector body HB.

The connector body HB may include a main body and a body cover. A connector hole COH for accommodating a memory connector MCN is placed on the front of the main body. The main body and the body cover may be provided as separate members and then fastened together, and may also define slots as described above, by being formed integrally so that some regions define a spaced space.

The connector hole COH is provided on the front of the main body. A horizontal width of the connector hole COH is equal to or greater than the horizontal width of the memory connector MCN of the storage device 200 to provide a space capable of storing the memory connector MCN. A plurality of connection terminals 176 may be placed inside the connector hole COH of the storage device 200. When the memory connector MCN of the storage device 200 is inserted into the connector hole COH, the connection terminal EL of the memory connector MCN and the connection terminal 176 of the host connector HCO are electrically connected to each other to interconnect the storage device 200 and the host. Although at least some of or all of the side faces, the upper and lower faces of the memory connector MCN inserted into the connector hole COH may be in contact with the inner walls of the connector hole COH for complete air-tightness, embodiments are not limited thereto.

The latch 170 may include a latch body 170_BD, and one or more hooks 171 placed at the end portion of the latch body 170_BD. The number and size of hooks 171 may correspond to the number and size of clamping holes CLH of the storage device 200.

The hook 171 may protrude outward from the end portion of the latch body 170_BD in the plan view. The outer face of the hook 171 may have a slope inclined inward toward a tip direction in the cross-sectional view. The cross section of the slope may be a straight line or a convex curve.

The inner face of the hook 171 may be a straight line or concave curve in the cross-sectional view. An absolute value of an angle formed by the inner face of the hook 171 and the hook body may be greater than an absolute value of an angle formed by the outer face of the hook 171 and the hook body.

The latch 170 may be joined to the connector body HB by a joint 172. The joint 172 may be configured to include a spring. Since the spring has a restoring force, even if the latch 170 is lifted up by an external force, the latch 170 may be lowered to an original position of the latch 170 when the external force is removed. The storage device 200 may be joined to the host connector HCO so that the hook 171 is fitted into the clamping hole CLH of the storage device 200 from above to below (e.g., from +Z direction to −Z direction) by the joint 172.

Hereinafter, a storage assembly according to some other embodiments will be described referring to FIGS. 13 to 18. Hereinafter, repeated explanation of the contents explained above will not be provided for conciseness, and differences will be mainly described.

First, a latch assembly will be described referring to FIGS. 13 and 14.

Figure 13:
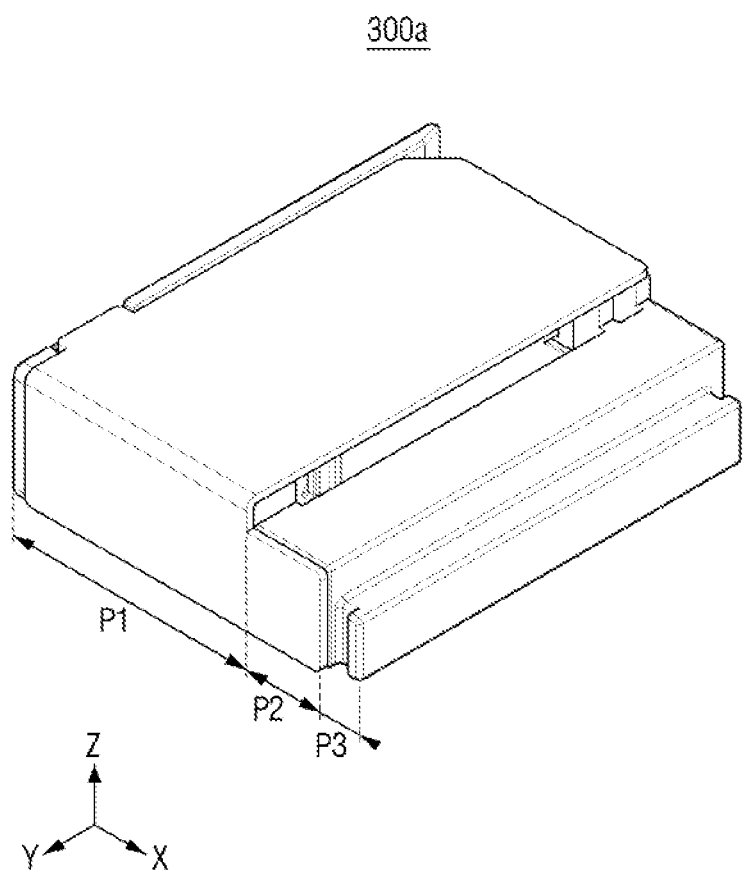
FIG. 13 is a perspective view of a latch assembly of a storage assembly according to some embodiments.

FIG. 13 is a perspective view of a latch assembly of a storage assembly according to some embodiments. FIG. 14 is a plan view of the latch assembly of FIG. 13.

Figure 14:
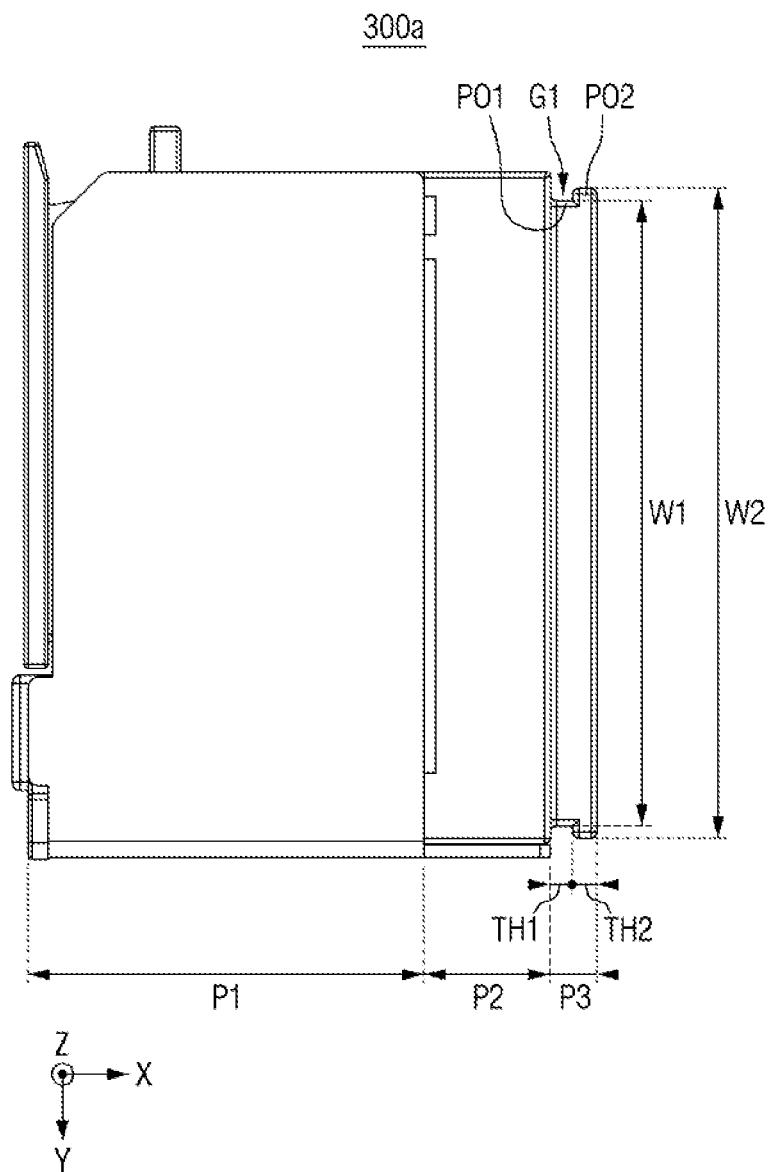
FIG. 14 is a plan view of the latch assembly of FIG. 13.

Referring to FIGS. 13 and 14, a latch assembly 300*a* may further include a third part P3.

The third part P3 may be placed to extend from the second part P2 in the first direction X. As shown, the upper face of the third part P3 may be lower than the upper face of the second part P2. That is, the first part P1, the second part P2, and the third part P3 may form a step shape and be connected to each other.

The third part P3 may include a first portion PO1 and a second portion PO2. The first portion PO1 may extend from the second part P2 in the first direction X, and the second portion PO2 may extend from the first portion PO1 in the first direction X. That is, the first portion PO1 may be placed to be closer to the second part P2 than the second portion PO2.

The first portion PO1 and the second portion PO2 may have different widths from each other, when measured in the second direction Y.

Specifically, a width W1 of the first portion PO1 in the second direction Y may be smaller than a width W2 of the second portion PO2 in the second direction Y. As a result, a groove G1 may be formed by the second part P2, the second portion PO2, and a side wall of the first portion PO1.

In some embodiments, the first portion PO1 and the second portion PO2 may have different thicknesses from each other, when measured in the first direction X.

For example, in some embodiments, a thickness TH1 of the first portion PO1 in the first direction X may be, for example, 0.5 to 0.7 mm, and a thickness TH2 of the second portion PO2 in the first direction X may be, for example, 0.8 to 1.2 mm. The thickness TH1 of the first portion PO1 in the first direction X and the thickness TH2 of the second portion PO2 in the first direction X described above may improve the joining reliability when the latch assembly 300*a* is joined to the storage device (200a of FIG. 15). More specific description thereof will be provided later.

Next, a storage device will be described referring to FIGS. 15 and 16.

Figure 15:
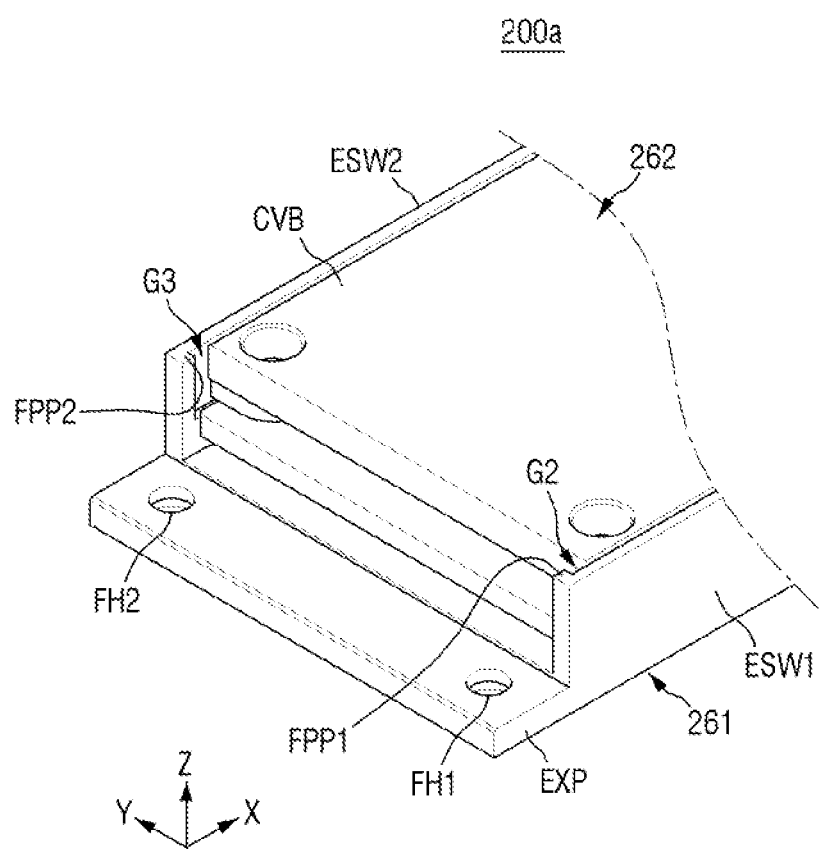
FIG. 15 is a diagram showing an enclosure assembly of a storage device according to some embodiments.

FIG. 15 is a diagram showing an enclosure assembly of a storage device according to some embodiments. FIG. 16 is a plan view of FIG. 15.

Figure 16:
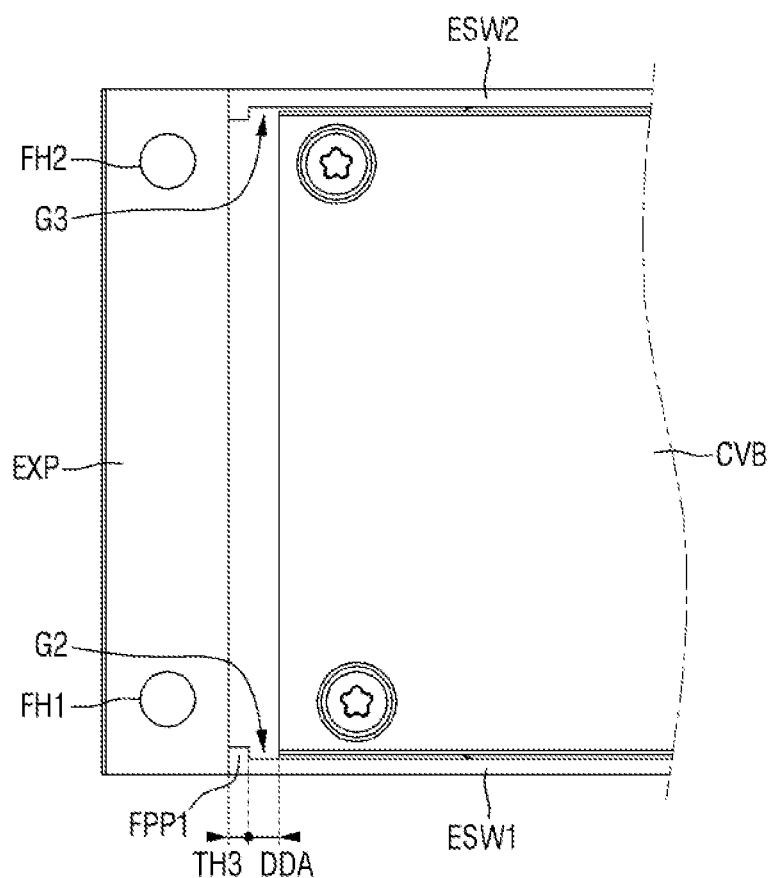
FIG. 16 is a plan view of the enclosure assembly of FIG. 15.

Referring to FIGS. 15 and 16, a storage device 200a may include the first enclosure 261 and the second enclosure 262.

As described above, the first side wall ESW1 is bent from the first long side LS1 of the top plate CVU of the first enclosure 261 and extends in the third direction Z. The second side wall ESW2 is bent from the second long side LS2 of the top plate CVU of the first enclosure 261 and extends in the third direction Z.

In the embodiment illustrated in FIGS. 15-16, the first side wall ESW1 includes a first bent part FPP1 bent in the second direction Y, and the second side wall ESW2 includes a second bent part FPP2 bent in the second direction Y.

The bottom plate CVB of the second enclosure 262 is placed at an interval DDA from the first bent part FPP1 and the second bent part FPP2. The interval may be predetermined. That is, the bottom plate CVB of the second enclosure 262 is not in contact with the first bent part FPP1 and the second bent part FPP2 but is placed apart by the interval DDA. As a result, a groove G2 may be formed by the first bent part FPP1, the first side wall ESW1 and the bottom plate CVB, and a groove G3 may be formed by the second bent part FPP2, the second side wall ESW2 and the bottom plate CVB. A second portion (PO2 of FIG. 14) of the latch assembly (300a of FIG. 14) described above may be inserted and accommodated into the grooves G2 and G3.

In some embodiments, the thickness TH3 of the first bent part FPP1 in the first direction X may be, for example, 0.5 to 0.7 mm. Although it is not described in detail, the thickness of the second bent part FPP2 in the first direction X may also be, for example, 0.5 to 0.7 mm.

In some embodiments, the interval DDA at which the bottom plate CVB is separated from the first bent part FPP1 and the second bent part FPP2 may be, for example, 0.8 to 1.2 mm.

The thickness TH3 of the first and second bent parts FPP1 and FPP2 in the first direction X, and the interval DDA of the bottom plate CVB spaced apart from the first bent part FPP1 and the second bent part FPP2 described above may increase the joining reliability when the storage device 200a is joined to the latch assembly (300a of FIG. 13). More specific description thereof will be provided later.

Next, the joining of the latch assembly 300a and the storage device 200a in a storage assembly according to some other embodiments will be described referring to FIGS. 17 and 18.

Figure 17:
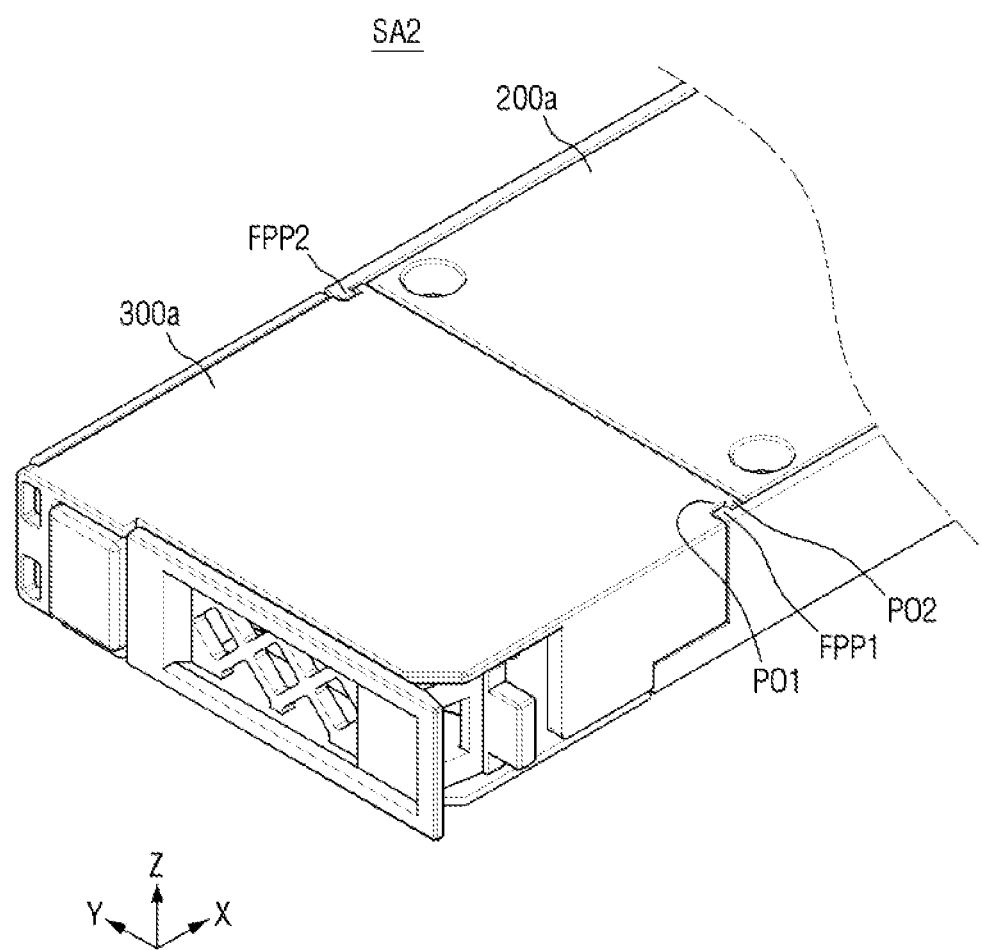
FIG. 17 is a diagram showing a state in which the latch assembly of FIG. 13 and the storage device of FIG. 15 according to some embodiments are joined.

FIG. 17 is a diagram showing a state in which the latch assembly 300a of FIGS. 13-14 and the storage device 200a of FIGS. 15-16 according to some embodiments are joined. FIG. 18 is a plan view of the latch assembly 300a and the storage device 200a of FIG. 17.

Figure 18:
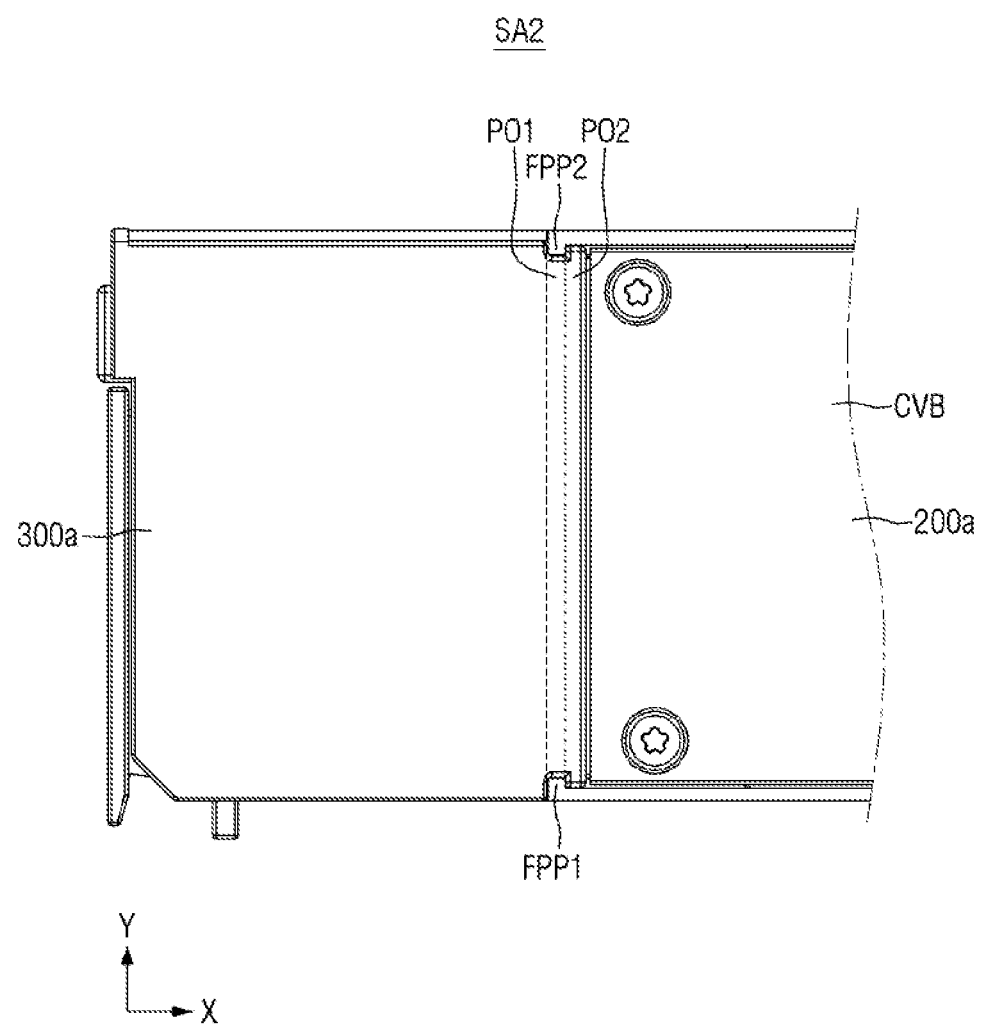
FIG. 18 is a plan view of the latch assembly and the storage device of FIG. 17.

Referring to FIGS. 17 and 18, the latch assembly 300a and the storage device 200a may be joined to form a storage assembly SA2.

Since the first and second bent parts FPP1 and FPP2 which are some of the side walls of the storage device 200a are inserted and accommodated to the groove G1 formed on the side wall of the first portion PO1 of the latch assembly 300a, and the second portion PO2 of the latch assembly 300a is inserted and accommodated to the grooves G2 and G3 between the bottom plate CVB and the first and second bent parts FPP1 and FPP2, respectively, the latch assembly 300a and the storage device 200a may be joined.

Referring to FIGS. 13 to 18, in some embodiments, since the thickness TH1 of the first portion PO1 in the first direction X and the thickness TH3 of the first and second bent parts FPP1 and FPP2 in the first direction X are formed similarly, and the thickness TH2 of the second portion PO2 in the first direction X and the interval DDA of the bottom plate CVB and the first and second bent parts FPP1 and FPP2 are formed similarly, the latch assembly 300a and the storage device 200a may be joined in the form of a transition fit.

In some embodiments, since the thickness TH1 of the first portion PO1 in the first direction X is formed to be smaller than the thickness TH3 of the first and second bent parts FPP1 and FPP2 in the first direction X, and the interval DDA between the bottom plate CVB and the first and second bent parts FPP1 and FPP2 is formed to be smaller than the thickness TH2 of the second portion PO2 in the first direction X, the latch assembly 300a and the storage device 200a may be joined in the form of an interference fit.

In some embodiments, since the thickness TH1 of the first portion PO1 in the first direction X is formed to be greater than the thickness TH3 of the first and second bent parts FPP1 and FPP2 in the first direction X, and the interval DDA between the bottom plate CVB and the first and second bent parts FPP1 and FPP2 is formed to be greater than the thickness TH2 of the second portion PO2 in the first direction X, the latch assembly 300a and the storage device 200a may be joined in the form of a clearance fit.

With the configuration described with reference to FIGS. 13-18, the latch assembly 300a may be easily attached to and detached from the storage device 200a. Therefore, attachment and detachment may be more easily performed as compared to a configuration in which the storage device 200a and the latch assembly 300a are attached and detached, for example, using a screw.

In some embodiments, the thickness TH2 of the second portion PO2 in the first direction X may be, for example, 0.8 to 1.2 mm. By maintaining the thickness TH2 of the second portion PO2 in the first direction X to 0.8 mm or more, it is possible to prevent the second portion PO2 of the latch assembly 300a from being damaged when the latch assembly 300a and the storage device 200a are joined. That is, the joining reliability My be improved.

Further, in the embodiment of FIGS. 13-18, the mounting properties of the memory module 270 placed inside the enclosure assembly 260 may be maintained, by maintaining the thickness TH2 of the second portion PO2 in the first direction X to 1.2 mm or more.

Hereinafter, a storage assembly according to some other embodiments will be described referring to FIG. 19.

Figure 19:
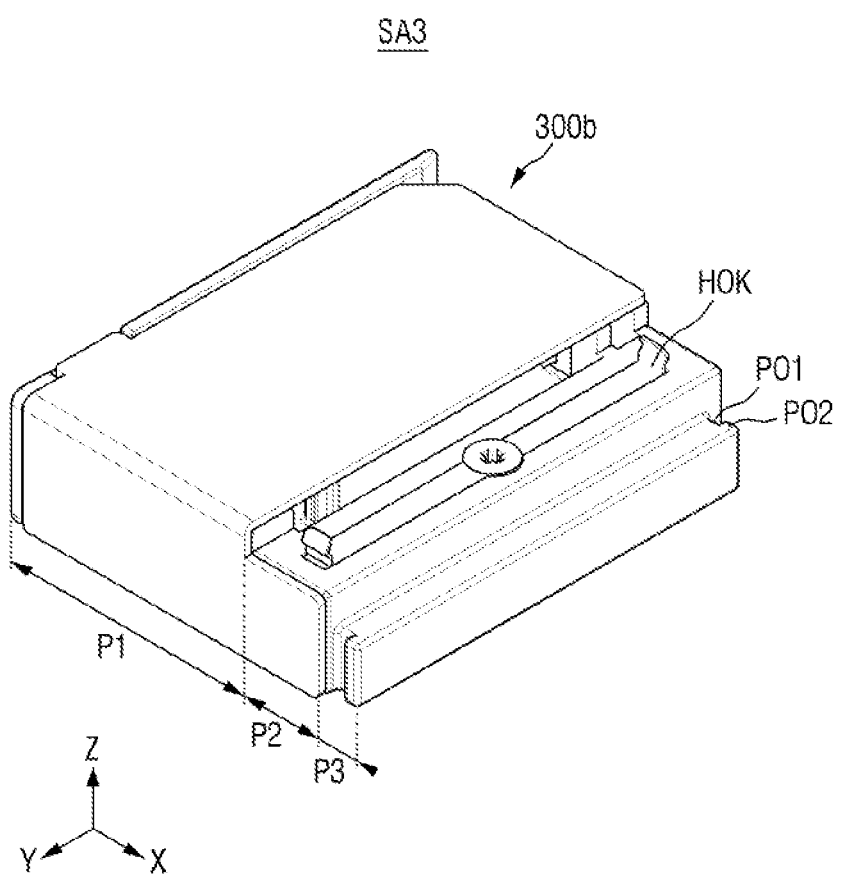
FIG. 19 is a perspective view of a latch assembly of a storage assembly according to some embodiments.

FIG. 19 is a perspective view of a latch assembly of a storage assembly according to some embodiments. Hereinafter, differences from the above-described embodiment will be mainly described.

Referring to FIG. 19, a storage assembly SA3 may include a latch assembly 300b.

The latch assembly 300b may include the first to third parts P1, P2 and P3.

The second part P2 may be placed to extend from the first part P1 in the first direction X. As shown, the upper face of the second part P2 may be lower than the upper face of the first part P1.

The third part P3 may be placed to extend from the second part P2 in the first direction X. As shown, the upper face of the third part P3 may be lower than the upper face of the second part P2. That is, the first part P1, the second part P2, and the third part P3 may form a step shape and be connected to each other.

The hook HOK may be placed on the upper face of the second part P2. Further, the third part P3 may include the first portion PO1 and the second portion PO2. That is, the latch assembly 300b according to the embodiment of FIG. 19 may include a combination of the joining structures of the embodiments described above with reference to FIGS. 1-18.

The latch assembly 300b may be joined, for example, to the storage device 200a shown in FIG. 15. The hook HOK of the latch assembly 300b is joined to the first and second joining parts FP1 and FP2 of the storage device 200a, the first and second bent parts FPP1 and FPP2 which are some of the side walls of the storage device 200a are joined into the grooves G1 formed on the side wall of the first portion PO1, and the second portion PO2 of the latch assembly 300b may be joined to the interval DDA between the bottom plate CVB and the first and second bent parts FPP1 and FPP2.

Figure 20:
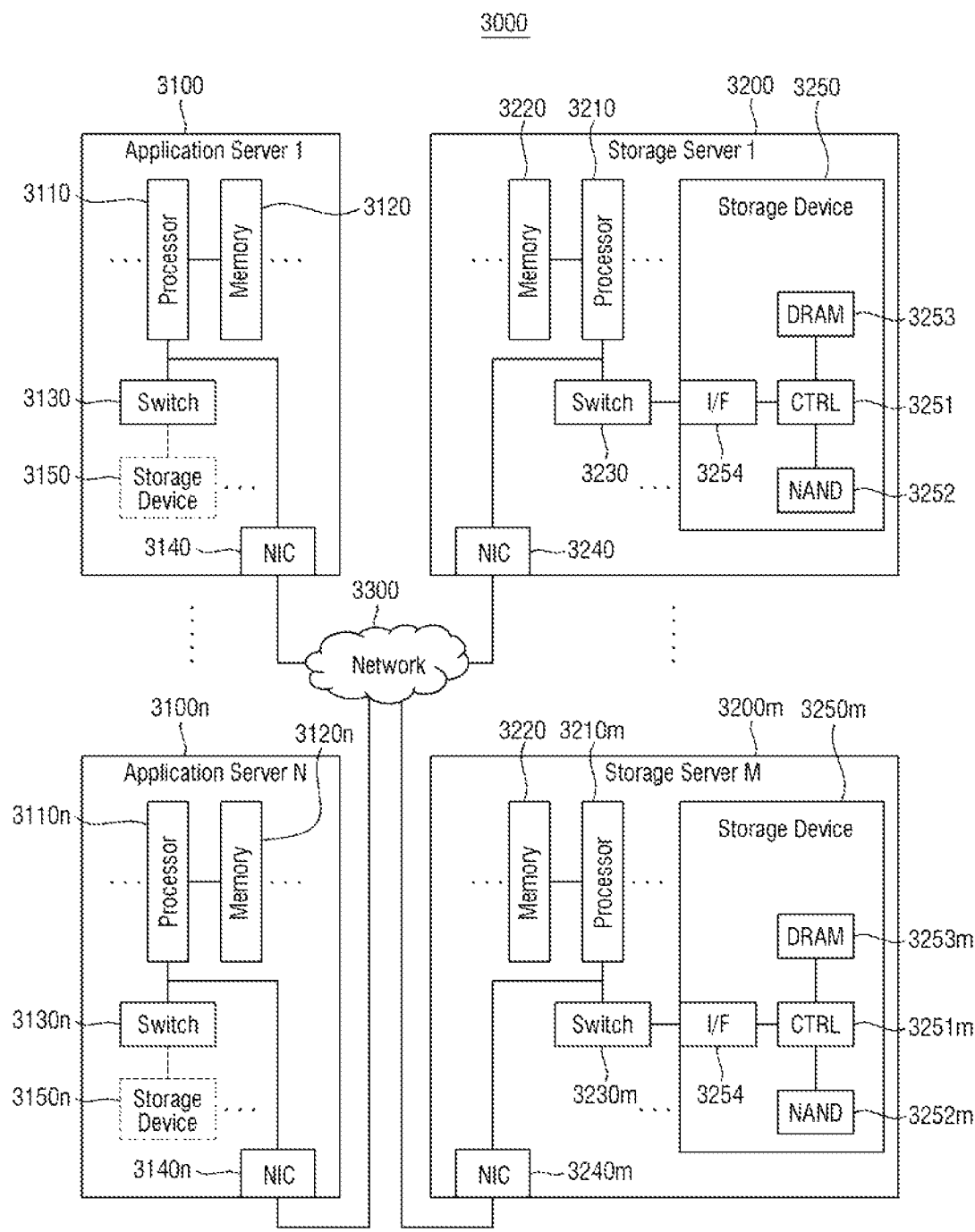
FIG. 20 is a diagram showing a data center to which the storage assembly according to some embodiments is applied.

FIG. 20 is a diagram showing a data center to which the storage assembly according to some embodiments is applied.

Referring to FIG. 20, a data center 3000 is a facility that collects various data and provides services, and may also be referred to as a data storage center. The data center 3000 may be a system for search engines and database operations, and may be a computing system used by companies such as banks or government agencies. The data center 3000 may include application servers 3100 to 3100n and storage servers 3200 to 3200m. The number of application servers 3100 to 3100n and the number of storage servers 3200 to 3200m may be variously selected according to various embodiments, and in some embodiments, the number of application servers 3100 to 3100n and the number of storage servers 3200 to 3200m may be different from each other.

The application server 3100 may include a processor 3110 and a memory 3120, and the storage server 3200 may include a processor 3210 and a memory 3220. Taking the storage server 3200 as an example, the processor 3210 may control the overall operation of the storage server 3200, access the memory 3220, and execute commands and/or data loaded into the memory 3220. The memory 3220 may be a DDR SDRAM (Double Data Rate Synchronous DRAM), a HBM (High Bandwidth Memory), a HMC (Hybrid Memory Cube), a DIMM (Dual In-line Memory Module), an Optane DIMM or a NVM DIMM (Non-Volatile DIMM). In some embodiments, the number of processors 3210 and the number of memories 3220 included in the storage server 3200 may be variously selected.

In some embodiments, the processor 3210 and memory 3220 may provide a processor-memory pair. In some embodiments, the number of processors 3210 and memories 3220 may be different from each other. The processor 3210 may include a single core processor or a multi-core processor. The description of the storage server 3200 may be similarly applied to the application server 3100. In some embodiments, the application server 3100 may omit a storage device 3150. The storage server 3200 may include at least one or more storage devices 3250. The number of storage devices 3250 included in the storage server 3200 may be variously selected according to the embodiments.

The storage assembly described above may be attached to or detached from the storage server 3200, which is host, in the form of a single storage device 3250.

The application servers 3100 to 3100n and the storage servers 3200 to 3200m may communicate with each other through the network 3300. The network 3300 may be implemented, using a FC (Fibre Channel), an Ethernet, or the like. FC is a medium used for relatively high-speed data transfer, and an optical switch that provides high performance/high availability may be used. The storage servers 3200 to 3200m may be provided as a file storage, a block storage or an object storage, depending on an access way of the network 3300.

In some embodiments, the network 3300 may be a storage-only network such as a SAN (Storage Area Network). For example, a SAN may be an FC-SAN which uses an FC network and may be implemented according to FCP (FC Protocol). In another example, the SAN may be an IP-SAN which uses a TCP/IP network and may be implemented according to an iSCSI (SCSI over TCP/IP or Internet SCSI) protocol. In some embodiments, the network 3300 may be a general network such as a TCP/IP network. For example, the network 3300 may be implemented according to protocols such as a FCoE (FC over Ethernet), a NAS (Network Attached Storage), and/or NVMe-oF (NVMe over Fabrics).

Hereinafter, the application server 3100 and the storage server 3200 will be mainly described. The description of the application server 3100 may also be applied to another application server 3100n, and the description of the storage server 3200 may also be applied to another storage server 3200m.

The application server 3100 may store the data requested to store by the user or client in one of the storage servers 3200 to 3200m through the network 3300. Further, the application server 3100 may acquire the data requested to read by the user or the client from one of the storage servers 3200 to 3200m through the network 3300. For example, the application server 3100 may be implemented by a Web server or a DBMS (Database Management System).

The application server 3100 may access the memory 3120n or the storage device 3150n included in another application server 3100n through the network 3300, or may access the memories 3220 to 3220m or the storage devices 3250 to 3250m included in the storage servers 3200 to 3200m through the network 3300. As a result, the application server 3100 may perform various operations on the data stored in the application servers 3100 to 3100n and/or the storage servers 3200 to 3200m. For example, the application server 3100 may execute commands for moving or copying the data between the application servers 3100 to 3100n and/or the storage servers 3200 to 3200m. The data may be moved from the storage devices 3250 to 3250m of the storage servers 3200 to 3200m via the memories 3220 to 3220m of the storage servers 3200 to 3200m or directly to the memories 3120 to 3120n of the application servers 3100 to 3100n. Data moving through the network 3300 may be data encrypted for security and privacy.

Taking the storage server 3200 as an example, the interface 3254 may provide a physical connection between the processor 3210 and the controller 3251, and a physical connection between the NIC 3240 and the controller 3251. For example, the interface 3254 may be implemented by a DAS (Direct Attached Storage) way in which the storage device 3250 is directly connected with a dedicated cable. For example, the interface 3254 may be implemented by various interface ways, such as an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe (NVM express), an IEEE 1394, a USB (universal serial bus), an SD (secure digital) card, a MMC (multi-media card), an eMMC (embedded multi-media card), a UFS (Universal Flash Storage), an eUFS (embedded Universal Flash Storage), and/or a CF (compact flash) card interface.

The storage server 3200 may further include a switch 3230 and a NIC 3240. The switch 3230 selectively connects the processor 3210 and the storage device 3250 according to the control of the processor 3210, or may selectively connect the NIC 3240 and the storage device 3250.

In some embodiments, the NIC 3240 may include a network interface card, a network adapter, and the like. The NIC 3240 may be connected to the network 3300 by a wired interface, a wireless interface, a Bluetooth interface, an optical interface, or the like. The NIC 3240 may include an internal memory, a DSP, a host bus interface, or the like, and may be connected to the processor 3210, and/or the switch 3230, or the like through the host bus interface. The host bus interface may also be implemented as one of the examples of the interface 3254 described above. In some embodiments, the NIC 3240 may also be integrated with at least one of the processor 3210, the switch 3230, and the storage device 3250.

In the storage servers 3200 to 3200m or the application servers 3100 to 3100n, the processor transmits the commands to the storage devices 3150 to 3150n and 3250 to 3250m or the memories 3120 to 3120n and 3220 to 3220m to program or read the data. The data may be data in which an error is corrected through an ECC (Error Correction Code) engine. The data is data subjected to data bus inversion (DBI) or data masking (DM) processing, and may include a CRC (Cyclic Redundancy Code) information. The data may be data encrypted for security and privacy.

The storage devices 3150 to 3150n and 3250 to 3250m may transmit the control signal and command/address signal to the NAND flash memory devices 3252 to 3252m in response to the read command received from the processor. As a result, when data is read from the NAND flash memory devices 3252 to 3252m, the RE (Read Enable) signal is input as the data output control signal and may serve to output the data to the DQ bus. DQS (Data Strobe) may be generated using the RE signal. Command and address signals may be latched to the page buffer, depending on a rising edge or a falling edge of the WE (Write Enable) signal.

The controller 3251 may generally control the operation of the storage device 3250. In some embodiments, the controller 3251 may include a SRAM (Static Random Access Memory). The controller 3251 may write data in the NAND flash 3252 in response to a write command, or may read the data from the NAND flash 3252 in response to a read command. For example, the write command and/or the read command may be provided from the processor 3210 in the storage server 3200, the processor 3210m in another storage server 3200m, or the processors 3110 and 3110n in the application servers 3100 and 3100n. The DRAM 3253 may temporarily store (buffer) the data to be written in the NAND flash 3252 or the data read from the NAND flash 3252. Also, the DRAM 3253 may store metadata. Here, the metadata is the data generated by the controller 3251 to manage the user data and the NAND flash 3252. The storage device 3250 may include an SE (Secure Element) for security or privacy.

Those skilled in the art will appreciate that many variations and modifications may be made to the various embodiments without substantially departing from the principles of the present disclosure. Therefore, the disclosed embodiments of the disclosure are used in a generic and descriptive sense only and not for purposes of limitation.

What is claimed is:

1. A storage device assembly comprising:
   a latch assembly; and
   a storage device configured to be joined to the latch assembly,
   wherein the latch assembly comprises:
      a first part,
      a second part which extends in a first direction from the first part, and has an upper face that is lower than an upper face of the first part, and
      a hook on the upper face of the second part and having elasticity, the hook including a first joining part that is bent away from the upper face of the second part at a first end of the hook, and a second joining part that is bent away from the upper face of the second part at a second end of the hook,
   wherein the storage device comprises:
      a memory module including a module board, and a memory connector on one side of the module board,
      a first enclosure above the memory module, the first enclosure including a first fixing hole configured to accommodate the first joining part, and a second fixing hole configured to accommodate the second joining part in a configuration in which the storage device is joined to the latch assembly, and
      a second enclosure below the memory module, and
   wherein the first fixing hole and the second fixing hole overlap with the upper face of the second part of the latch assembly.

2. The storage device assembly of claim 1, wherein the first fixing hole comprises:
   a first through hole which has a first inner diameter and through which the first joining part penetrates in the configuration in which the storage device is joined to the latch assembly, and
   a first extension hole which is above the first through hole, is spatially interconnected with the first through hole, and has a second inner diameter larger than the first inner diameter, the first extension hole accommodating one end of the first joining part therein in the configuration in which the storage device is joined to the latch assembly.

3. The storage device assembly of claim 2, wherein the first joining part comprises:
   a first extension which extends in a direction penetrating the first through hole in the configuration in which the storage device is joined to the latch assembly,
   a second extension which extends from the first extension toward an inner wall of the first extension hole in the configuration in which the storage device is joined to the latch assembly, and
   a third extension which extends from the second extension toward a center of the first extension hole in the configuration in which the storage device is joined to the latch assembly.

4. The storage device assembly of claim 3, wherein the second extension is in contact with an inner wall of the first through hole in the configuration in which the storage device is joined to the latch assembly.

5. The storage device assembly of claim 1, wherein a thickness of the hook is 0.1 mm to 0.5 mm.

6. The storage device assembly of claim 5, wherein the first fixing hole comprises:
   a first through hole having an inner diameter of 2.6 mm to 2.8 mm and a depth of 0.9 mm to 1.1 mm, and
   a first extension hole which is above the first through hole, is spatially interconnected with the first through hole, and has an inner diameter of 4.6 mm to 4.8 mm and a depth of 1.1 mm to 1.3 mm.

7. The storage device assembly of claim 1, wherein the first enclosure comprises:
a top plate, a first side wall extending from a first long side of the top plate in a second direction intersecting the first direction, and a second side wall extending from a second long side of the top plate in the second direction,
the top plate includes an extension that extends in the first direction beyond the first side wall and the second side wall, and
the first fixing hole and the second fixing hole are formed in the extension.

8. The storage device assembly of claim 1, wherein the latch assembly further comprises:
a third part which extends from the second part in the first direction, and has an upper face that is lower than the upper face of the second part,
a side wall of the third part includes a groove, and
a part of a side wall of the first enclosure is accommodated into the groove in the configuration in which the storage device is joined to the latch assembly.

9. The storage device assembly of claim 8, wherein the first enclosure comprises:
a top plate, a first side wall extending from a first long side of the top plate in a second direction intersecting the first direction, and a second side wall extending from a second long side of the top plate in the second direction,
the first side wall includes a bent part which is bent in a third direction intersecting the first direction and the second direction, and
the bent part is accommodated into the groove of the latch assembly in the configuration in which the storage device is joined to the latch assembly.

10. The storage device assembly of claim 9, wherein the second enclosure includes a bottom plate, and
one end of the bottom plate is spaced apart from the bent part by an interval.

11. The storage device assembly of claim 10, wherein the interval is 0.8 mm to 1.2 mm.

12. A storage device comprising:
a memory module which includes a module board, and a memory connector placed on one side of the module board;
a first enclosure above the memory module; and
a second enclosure below the memory module,
wherein the first enclosure includes a top plate, a first side wall extending from a first long side of the top plate in a first direction, and a second side wall extending from a second long side of the top plate in the first direction,
the top plate includes an extension that extends beyond corresponding end portions of the first side wall and the second side wall in a second direction intersecting the first direction,
a first fixing hole and a second fixing hole are formed in the extension,
the first side wall includes a first bent part which is bent in a third direction intersecting the first direction and the second direction,
the second enclosure includes a bottom plate,
one end of the bottom plate is spaced apart in the second direction from the first bent part by an interval, and
the extension of the top plate extends beyond the one end of the bottom plate in the second direction.

13. The storage device of claim 12, wherein the second side wall includes a second bent part which is bent in the third direction and faces the first bent part, and
the one end of the bottom plate of the second enclosure is spaced apart from the second bent part by the interval.

14. The storage device of claim 13, wherein the interval is 0.8 mm to 1.2 mm.

15. A latch assembly comprising:
a first part;
a second part which extends in a first direction from a distal end of the first part, and has an upper face that is lower than an upper face of the first part;
a third part which extends in the first direction from a distal end of the second part, and has an upper face that is lower than the upper face of the second part,
wherein the third part comprises:
a first portion having a first width measured in a second direction V-intersecting the first direction, and
a second portion having a second width measured in the second direction, the first width being smaller than the second width, and
wherein the third part further comprises a groove formed by a sidewall of the second part, the second portion, and a side wall of the first portion.

16. The latch assembly of claim 15, wherein the first portion is closer to the second part than the second portion.

17. The latch assembly of claim 16, wherein a thickness of the second portion measured in the first direction is 0.8 mm to 1.2 mm.

18. The latch assembly of claim 15, further comprising:
a hook on the upper face of the second part and having elasticity, the hook comprising a first joining part that is bent away from the upper face of the second part at a first end of the hook, and a second joining part that is bent away from the upper face of the second part at a second end of the hook.

19. The latch assembly of claim 18, wherein the first joining part comprises
a first extension that extends from the upper face of the second part,
a second extension that is bent and extends from the first extension, and
a third extension that is bent and extends from the second extension.

20. The latch assembly of claim 19, wherein a thickness of the hook is 0.1 mm to 0.5 mm.

* * * * *